(12) United States Patent
Hayashi et al.

(10) Patent No.: US 6,703,181 B1
(45) Date of Patent: *Mar. 9, 2004

(54) PHOTOSENSITIVE COMPOSITION HAVING UNIFORM CONCENTRATION DISTRIBUTION OF COMPONENTS AND PATTERN FORMATION METHOD USING THE SAME

(75) Inventors: Takao Hayashi, Tokyo (JP); Yasunobu Onishi, Yokohama (JP); Kazuo Sato, Yokohama (JP); Kenji Chiba, Yokohama (JP); Masataka Miyamura, Kamakura (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 252 days.

(21) Appl. No.: 08/709,879

(22) Filed: Sep. 9, 1996

Related U.S. Application Data

(63) Continuation of application No. 08/494,303, filed on Jun. 23, 1995, now abandoned, which is a continuation of application No. 08/208,811, filed on Mar. 11, 1994, now abandoned.

(30) Foreign Application Priority Data

Mar. 12, 1993 (JP) ............................................. 5-079113
Jun. 30, 1993 (JP) ............................................. 5-189396

(51) Int. Cl.[7] ................................................ G03C 1/76
(52) U.S. Cl. ...................... 430/270.1; 430/325; 522/15; 522/31
(58) Field of Search ............................. 430/270.1, 325; 522/15, 31

(56) References Cited

U.S. PATENT DOCUMENTS

| 4,792,516 A | * 12/1988 | Toriumi et al. ............. 430/325 |
| 4,943,516 A | * 7/1990 | Kamayachi et al. ........ 430/271 |
| 5,091,282 A | * 2/1992 | Onishi et al. ............... 430/270 |
| 5,202,217 A | * 4/1993 | Todoko et al. .............. 430/270 |
| 5,292,614 A | * 3/1994 | Ochiai et al. ............... 430/270 |
| 5,332,648 A | * 7/1994 | Kihara et al. ............... 430/270 |
| 5,348,838 A | * 9/1994 | Ushirogouchi et al. ..... 430/270 |

FOREIGN PATENT DOCUMENTS

| EP | 0558280 | * 9/1993 |
| JP | 63149640 | 6/1988 |
| JP | 227660 | 6/1990 |
| JP | 03-206458 | 9/1991 |
| JP | 04-080758 | 3/1992 |
| JP | 04-134345 | 5/1992 |
| JP | 04-217251 | 8/1992 |
| JP | 04-251259 | 9/1992 |
| JP | 05-249662 | 10/1992 |

(List continued on next page.)

*Primary Examiner*—Laura Weiner
(74) *Attorney, Agent, or Firm*—Oblon, Spivak, McClelland, Maier & Neustadt, P.C.

(57) ABSTRACT

There is provided a photosensitive composition suitable for a resist material. This photosensitive composition has a high sensitivity and a high resolution with respect to a light source having a short wavelength, does not cause a phase separation in a film state, and makes it possible to stably form fine resist patterns. The photosensitive composition contains a polymer obtained by protecting an alkali-soluble group of an alkali-soluble polymer by a group which is unstable with respect to an acid, a compound which generates an acid upon being irradiated with light, at least one compound which is selected from the group consisting of an imidazole compound, an alanine compound, an adenine compound, an adenosine compound, and a quaternary ammonium salt compound, and which increases miscibility in a resist film, and a phenol compound.

24 Claims, 2 Drawing Sheets

FOREIGN PATENT DOCUMENTS

| | | |
|---|---|---|
| JP | 04-321049 | 11/1992 |
| JP | 05-127369 | 5/1993 |
| JP | 05-181279 | 7/1993 |
| JP | 05-232706 | 9/1993 |
| JP | 05-249683 | 9/1993 |
| JP | 06-095389 | 4/1994 |

* cited by examiner

PHOTOSENSITIVE COMPOSITION HAVING UNIFORM CONCENTRATION DISTRIBUTION OF COMPONENTS AND PATTERN FORMATION METHOD USING THE SAME

This application is a continuation of application Ser. No. 08/494.303, filed on Jun. 23, 1995, now abandoned, which is a continuation application of Ser. No. 08/208,811, filed on Mar. 11, 1994, now abandoned.

BACKGROUND OF THE INVENTION

1. Field of the Invention

The present invention relates to a photosensitive composition and a pattern formation method for use in micropatterning of semiconductor devices, specifically, large-scale integrated circuits (LSIs).

2. Description of the Related Art

The manufacture of semiconductor devices such as LSIs makes use of a micropatterning technique performed by photolithography. This technique is done in accordance with the following processes. That is, a photo-resist film is first formed on a substrate, such as a silicon single-crystal wafer, by, e.g., spin coating and then the film is exposed. Thereafter, treatments such as developing and rinsing are performed for the resist film, thereby forming a resist pattern. Subsequently, the exposed wafer surface is etched by using the resist pattern as an anti-etching mask to form lines and windows with small widths, thereby forming a desired pattern.

In the manufacture of LSIs, as the packing density of LSIs has increased, a processing technique capable of forming finer patterns has been required in lithography. To meet this requirement, it has been conventionally attempted to shorten the wavelength of the exposure light source. As one such attempt, a lithography technique using as its light source deep UV, such as a KrF excimer laser (wavelength 248 nm) or an ArF excimer laser (wavelength 193 nm), has been examined.

Conventional resist materials, however, have an excessively large absorbance for deep UV. Therefore, it is impossible to make UV light sufficiently reach a portion apart from the surface of a resist film (e.g., an interface region between a resist film and a substrate) during exposure. Consequently, the chemical change which is due to the exposure does not occur satisfactorily throughout the total film thickness in the exposed portion of the resist film. The result is a nonuniform solubility in the direction of thickness with respect to a developing solution. The solubility especially in the portion apart from the surface of the resist film as described above is poor, and so the sectional shape of a resist pattern formed after development becomes triangular in that portion. This brings about a problem when the resultant resist pattern is to be used as an anti-etching mask; i.e., it is impossible to transfer a fine pattern of interest onto a substrate or the like.

As a resist material by which the above problem can be solved, a resist called a chemical amplification type resist has been proposed. The chemical amplification type resist is a photosensitive composition containing a compound which generates a strong acid upon being irradiated with light, i.e., a photo-acid generator, and a compound which changes into a hydrophilic substance if its hydrophobic group is decomposed by the acid generated. As a practical example of such resist material, U.S. Pat. No. 4,491,628 (1985) to H. Ito, C. G. Wilson, and J. M. J. Frechet discloses a positive resist containing a polymer which is obtained by blocking a hydroxyl group of poly(p-hydroxystyrene) by a butoxycarbonyl group, and an onium salt as the photo-acid generator. In addition, M. J. O'Brien, J. V. Crivello, SPIE, Vol. 920, Advances in Resist Technology and Processing, p. 42 (1988) discloses a positive resist containing an m-cresol novolak resin, a naphthalene-2carboxylic acid-tert-butylester, and a triphenylsulfonium salt as the photo-acid generator. Also, H. Ito, SPIE, Vol. 920, Advances in Resist Technology and Processing, p. 33 (1988) discloses a positive resist containing 2,2-bis(4-tert-butoxycarbonyloxyphenyl)propane or polyphthalaldehyde, and an onium salt as the photo-acid generator.

In each of these chemical amplification type resists, the acid generated by the photo-acid generator functions as a catalyst to bring about a chemical change efficiently inside the resist even with a small amount. When the resist film is exposed, therefore, the reaction proceeds sufficiently even in the interior of the film to which it is difficult to make a radiation reach compared with the film surface. This consequently makes it possible to form, after development is performed, a resist pattern having a rectangular sectional shape, particularly, a resist pattern in which the side surface of a line portion is steep and vertical.

In the above chemical amplification type resists, however, the amount of the acid generated in the exposed portion of the resist film is very small. Therefore, the resist is readily affected by the surrounding environment, especially the atmospheric oxygen and moisture and other atmospheric trace components on the surface of the resist film. This makes it difficult to stably form fine patterns. More specifically, a slight amount of dimethylaniline contained in the atmosphere deactivates an acid generated near the surface of the resist film upon irradiation of light. As a result, a so-called sparingly soluble layer whose rate of dissolution with respect to a developing solution is very low is formed on the surface of the resist film. It is reported that this sparingly soluble layer remains as an overhang on the surface of the resist pattern after exposure and development (S. A. MacDonald, N. J. Cleark, H. R. Werdt, C. G. Willson, C. D. Snyder, C. J. Knors, N. B. Deyoe, J. G. Maltabes, J. R. Morrow, A. E. MacGuire, and S. J. Hplmes, Proc. SPIE, Vol. 1466, 2 (1991)).

This sparingly soluble layer reduces the resolution of the resist, and an overhang formed on the resist pattern by the sparingly soluble layer adversely affects the etching accuracy of a semiconductor substrate region. To prevent the formation of this overhang-like sparingly soluble layer, as shown in FIG. 3A, exposure is performed after the atmospheric influence is reduced by forming a protective layer 8 on a resist film (Jpn. Pat. Appln. KOKAI Publication No. 4-2040848). Even by this method, however, an overhang cannot be completely removed, and an overhang-like sparingly soluble layer 9 as shown in FIG. 3B is formed on the side walls of a resist pattern 6. This method of forming a protective layer has problems in addition to the above problem; i.e., the method requires an additional coating device and degrades the workability because the number of processes is increased.

On the other hand, it is known that the resolution can be increased by adding to a chemical amplification type resist composition any of aniline-type, imidazole-type, pyridine-type, and ammonia-type derivatives each of which acts as a base with respect to the acid generated upon irradiation of light (Jpn. Pat. Appln. KOKAI Publication No. 5-127369). However, the miscibility of these amine-type compounds with respect to a low-molecular compound (to be described later) has not been reported yet.

In addition, in the formation of a pattern using the above chemical amplification type resist, when a resist film is formed, i.e., when a resist solution is coated on a substrate, a phase separation is sometimes caused in the film by the difference in molecular weight between components, resulting in a nonuniform concentration distribution of each component. As a result, the chemical change does not proceed uniformly in the exposed portion of the film, so a fine resist pattern with a rectangular sectional shape cannot be obtained stably.

The phase separation is described more specifically in H. Ito, J. Polymer. Sci.: Part A 24, 2971 (1986) which reports that in the synthesis of polyvinyl phenol, which is used as one component of a resist material, and in which phenolic hydroxyl groups are partially protected by tert-butoxycarbonyl, the phase separation occurs depending on the introduction rate of the protective groups of that polymer. The concentration distribution of a component in a resist film is described more specifically in M. Toriumi, M. Yanagimachi, and H. Masuhara, Proc. SPIE, Vol. 1466, 458 (1991).

It is also known that in the pattern formation using the chemical amplification type resist, the line width changes in correspondence with the baking temperature after exposure, and this decreases the sensitivity (J. Sturtevant, S. Holmes, P. Rablidoux, Advances in Resist Technology and Processing IX, SPIE, Vol. 1672, 114 (1992). Therefore, it is necessary to precisely control the baking temperature, resulting in a poor workability.

The present invention has been made in consideration of the above situations and has as its object to provide a photosensitive composition which has a high sensitivity and resolution with respect to particularly a light source with a short wavelength, which does not cause a phase separation in a film state, which is not readily influenced by the surrounding atmosphere, and by which fine resist patterns can be obtained stably.

SUMMARY OF THE INVENTION

The above object of the present invention can be achieved by photosensitive compositions according to the following first and second inventions.

The photosensitive composition according to the first invention contains (a) a polymer obtained by protecting an alkali-soluble group of an alkali-soluble polymer by a group which is unstable with respect to an acid, (b) a compound which generates an acid upon being irradiated with light, and (c) at least one compound which is selected from the group consisting of an imidazole compound, an alanine compound, an adenine compound, an adenosine compound, and a quaternary ammonium salt compound, and which increases miscibility in a resist film.

The photosensitive composition according to the second invention contains (a) a polymer obtained by protecting an alkali-soluble group of an alkali-soluble polymer by a group which is unstable with respect to an acid, (b) a compound which generates an acid upon being irradiated with light, and (d) a phenol compound.

In addition, a photosensitive composition according to the third invention contains (a) a polymer obtained by protecting an alkali-soluble group of an alkali-soluble polymer by a group which is unstable with respect to an acid, (b) a compound which generates an acid upon being irradiated with light, (c) at least one compound which is selected from the group consisting of an imidazole compound, an alanine compound, an adenine compound, an adenosine compound, and a quaternary ammonium salt compound, and which increases miscibility in a resist film, and (d) a phenol compound.

A manufacturing method of the present invention comprises the steps of forming, on a substrate, a resin layer containing the photosensitive composition according to any of the first, second, and third inventions as its main constituent, performing pattern exposure for the resin layer, baking the exposed resin layer, and developing the baked resin layer by using an alkali solution as a developing solution.

The photosensitive composition of the present invention corresponds to the positive chemical amplification type resist. That is, when this photosensitive composition is applied to a pattern formation process, an acid is generated from the component (b) in the exposed portion of the photosensitive composition. Upon baking, this acid acts as a catalyst to decompose the group which is contained in the component (a) and unstable with respect to the acid, thereby making the group produce an alkali-soluble group. As a result, the alkali solubility, i.e., the dissolution rate with respect to an alkali solution is raised in the component (a) in this exposed portion. Therefore, the exposed portion is selectively dissolved away by performing development by using an alkali solution. This makes it possible to form a fine pattern consisting of lines and spaces with predetermined widths.

The photosensitive composition according to the first invention contains, in addition to the components (a) and (b), the component (c), i.e., at least one compound selected from the group consisting of an imidazole compound, an alanine compound, an adenine compound, an adenosine compound, and a quaternary ammonium salt compound. In this photosensitive composition, this component (c) increases the resolution by acting as a base with respect to the acid generated by irradiation of light. The component (c) also increases the miscibility between the polymer as the component (a) and the low-molecular-weight compound as the component (b). This prevents a phase separation in a film state. Therefore, the concentration distribution of each component is maintained constant across the entire film, and the chemical change caused by exposure or the like proceeds evenly. In the present invention, fine patterns are formed by this effect of high miscibility. In addition, since the component (c) increases the alkali solubility in the exposed portion of the film, the formation of an overhang-like sparingly soluble layer can be prevented without forming any protective film on the resist film. Furthermore, even if the time period from the exposure to the heat treatment performed by baking is prolonged in the pattern formation process, the photosensitive composition according to the first invention controls diffusion of the acid generated by the exposure, making the formation of fine patterns possible.

The photosensitive composition according to the first invention, therefore, keeps its high sensitivity and resolution inherent in the chemical amplification type resist, is stable throughout the whole pattern formation process, and provides a fine pattern having a rectangular sectional shape. As described above, the first invention makes it unnecessary the use of a protective film which is required in conventional chemical amplification type resists. In addition, it is also possible to omit a protective film formation step, and this reduces the total number of steps in the manufacturing process.

The second photosensitive composition of the present invention is a composition containing, as its essential components, (a) a polymer obtained by protecting an alkali-soluble group of an alkali-soluble polymer by a group which is unstable with respect to an acid, (b) a compound which generates an acid upon being irradiated with light, and (d) a phenol compound.

This second photosensitive composition also corresponds to the positive chemical amplification type resist. Therefore, when applied to the pattern formation process, the second photosensitive composition provides fine patterns in accordance with the same mechanism as that of the above first composition.

The second photosensitive composition contains the component (d), i.e., a phenol compound, in addition to the components (a) and (b). In the second photosensitive composition, this phenol compound increases the miscibility between the polymer as the component (a) and the low-molecular-weight compound as the component (b). For this reason, as in the above first composition, no phase separation takes place in a film state, the concentration distribution of each component is kept constant across the entire film, and the chemical change caused by exposure or the like proceeds evenly. Especially in this second photosensitive composition, it is assumed that a hydroxyl group contained in the phenol compound reacts with the alkali-soluble group which is not protected but remains in the polymer as the component (a), thereby preventing separation of the component (a) with a high molecular weight. In addition, since the phenol compound increases the alkali solubility in the exposed portion of the film, the alkali solubility of the resist film can be increased compared to those of conventional resist films. Therefore, the formation of a sparingly soluble layer on the film surface can be prevented. Furthermore, since the photosensitive composition according to the second invention has a large focus margin, fine patterns can be formed even if a focusing error occurs during the exposure. This makes it possible to increase the working efficiency. The second photosensitive composition also can make it unnecessary the use of a protecting film, which is required in conventional chemical amplification type resists, by controlling the amounts of the photo-acid generator and at least one compound selected from the group consisting of an imidazole compound, an alanine compound, an adenine compound, an adenosine compound, and a quaternary ammonium salt compound.

As described above, the second photosensitive composition of the present invention keeps its high sensitivity and resolution inherent in the chemical amplification type resist, is stable throughout the whole pattern formation process, and provides a fine pattern having a rectangular sectional shape.

The photosensitive composition according to the third invention contains a phenol compound as a component (d), in addition to the components (a), (b), and (c) of the first composition. Since the components (c) and (d) further increase the miscibility between the polymer as the component (a) and the low-molecular-weight compound as the component (b), a phase separation in a film state can be prevented. In addition, the combination of the components (c) and (d) greatly raises the dissolution rate with respect to an alkali solution in the exposed portion of the film. This prevents the formation of a sparingly soluble layer on the film surface and also improves the contrast between the exposed and unexposed portions.

The photosensitive composition according to the third invention, therefore, keeps its high sensitivity and resolution inherent in the chemical amplification type resist, and is more stable than the composition according to the first invention throughout the whole pattern formation process. Consequently, the third photosensitive composition provides a fine pattern having a rectangular sectional shape, in which not only the formation of an overhang-like sparingly soluble layer on the film surface is prevented, but also a standing-wave effect on the side surfaces of the film is reduced or eliminated (the standing-wave effect is an effect by which a wave having a predetermined period is produced on the side surfaces of the resist because energy stored in the resist film varies in the direction of depth of the resist film due to reflection of exposure light from the resist surface and an interference effect of light components reflected by the resist film and the surface of a substrate).

The photosensitive composition according to the third invention also can make the use of a protective film unnecessary. Consequently, the total number of steps in the manufacturing process can be reduced since a protective film formation step can be omitted.

The present invention further provides a pattern formation method using any of the first, second, and third photosensitive compositions described above. That is, the pattern formation method of the present invention comprises the steps of forming, on a substrate, a resin layer containing any of the above first, second, and third photosensitive compositions as its main constituent, exposing a pattern on the resin layer, baking the exposed resin layer, and developing the baked resin layer by using an alkali solution as a developing solution.

The pattern formation method of the present invention can increase the working efficiency because the sensitivity does not change even if the baking temperature changes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which is incorporated in and constitutes a part of the specification, illustrates presently preferred embodiments of the invention and, together with the general description given above and the detailed description of the preferred embodiments given below, serves to explain the principles of the invention.

Figure 1:
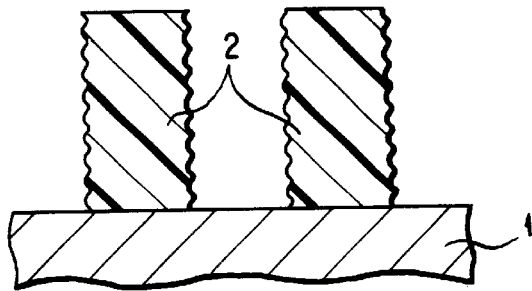
FIG. 1 is a schematic view showing the shape of a pattern formed by using the photosensitive composition of the present invention.

In these drawings, reference numerals have the following meanings. 1 . . . substrate; 2 . . . resist pattern; 3 . . . substrate; 4 . . . resist pattern; 5 . . . substrate; 6 . . . resist pattern; 7 . . . exposed region; 8 . . . protective film; 9 . . . overhang-like sparingly soluble layer

DETAILED DESCRIPTION OF THE PREFERRED EMBODIMENTS

The present invention will be described in detail below.

In the photosensitive composition according to the first invention, the polymer as the component (a) is a compound formed by using an alkali-soluble polymer as a base polymer and protecting an alkali-soluble group, e.g., a phenolic hydroxyl group or a carboxyl group, in this base polymer by a group (a protective group) which is unstable with respect to an acid, thereby suppressing the alkali affinity of the polymer. This polymer is essentially insoluble in an alkali solution in an unexposed state. When exposed to light, however, the polymer changes into a compound with an alkali solubility since the protective group is deprotected by an acid generated by the component (b), and this reproduces the alkali-soluble group that the base polymer originally has. Note that the molecular weight of this polymer is preferably about 1,000 or more in order to improve the heat resistance.

As this polymer as the component (a), it is possible to use preferably an ether or ester containing an alkali-soluble polymer having a phenol skeleton as a base polymer. A practical example of the polymer is a compound obtained by protecting a phenolic hydroxyl group of a polymer having a phenol skeleton by etherifying or esterifying the phenolic hydroxyl group by using an appropriate etherifying or esterifying agent.

Examples of the alkali-soluble polymer having a phenol skeleton are a polymer having, as its monomer unit, a phenol, cresol, xylenol, bisphenol A, bisphenol S, hydroxybenzophenone, 3,3,3',3'-tetramethyl-1,1'-spirobiindane-5,6,7,5',6',7'-hexanol, or phenolphthalein; polyvinyl phenol; and a novolak resin.

Examples of the ether and the ester to be introduced as the protective group to the alkali-soluble polymer having a phenol skeleton are tetrahydropyranylether, benzylether, methylether, ethylether, n-propylether, iso-propylether, tert-butylether, allylether, methoxymethylether, p-bromophenacylether, trimethylsilylether, benzyloxycarbonylether, tert-butoxycarbonylether, tert-butylacetate, 4-tert-butylbenzylether, methylester, ethylester, n-propylester, iso-propylester, tert-butylester, n-butylester, iso-butylester, and benzylester.

In the above polymer, the phenolic hydroxyl groups contained in the base polymer are not entirely protected but partially left unprotected in the polymer. Therefore, this polymer is essentially a copolymer consisting of a monomer unit to which an ether or ester is introduced, and a monomer unit having the phenolic hydroxyl group.

Most preferable examples of the polymer as the component (a) are compounds represented by Formulas (1) to (4) below.

Formula (1):

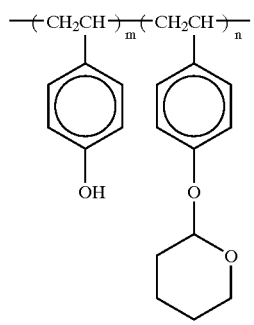

-continued

Formula (2):

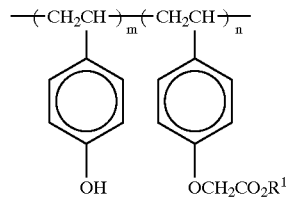

Formula (3):

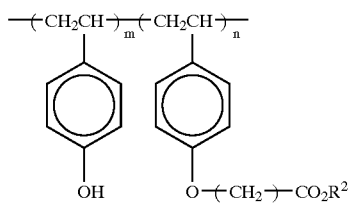

Formula (4):

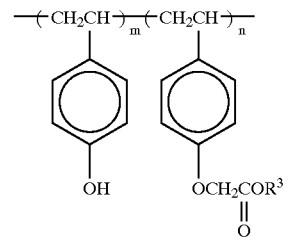

In the above formulas, each of $R^1$, $R^2$, and $R^3$ represents a monovalent organic group, and each of m a n represents a copolymer composition. This monovalent organic group is not particularly limited. Examples of the monovalent group are methyl, ethyl, n-propyl, iso-propyl, n-butyl, tert-butyl, iso-butyl, sec-butyl, and benzyl.

The mixing amount of the component (a) is preferably 5 to 80 wt %, and more preferably 10 to 60 wt % with respect to the total solid content of the composition.

In the photosensitive composition according to the first invention, the component (b) is a compound which generates an acid upon being exposed, and corresponds to a photo-acid generator of a chemical amplification type resist. As this compound, it is possible to use compounds and mixtures known as photo-acid generators, e.g., an onium salt, an organic halogen compound, orthoquinone-diazidosulfonic acid chloride, and sulfonates.

The onium salt is not particularly limited. Examples of the onium salt are a diazonium salt, a phosphonium salt, a sulfonium salt, and an iodonium salt, each having $CF_3SO_3—$, $p\text{-}CH_3PhSO_3—$, or $p\text{-}NO_2PhSO_3—$ (wherein Ph represents a phenyl group) as a counter anion.

The above organic halogen compound is a compound which forms a halogenated hydroacid. Examples of this compound are those disclosed in U.S. Pat. Nos. 3,515,552, 3,536,489, and 3,779,778, and West German Patent No. 2,243,621.

Examples of the photo-acid generator other than those enumerated above are compounds disclosed in Jpn. Pat. Appln. KOKAI Nos. 54-74728, 55-24113, 55-77742, 60-3626, 60-138539, 56-17345, and 50-36209.

Practical examples of these compounds are di(p-tert-butylbenzene)iodonium trifluoromethanesulfonate, diphenyliodonium trifluoromethanesulfonate, benzointosylate, orthonitrobenzyl paratoluenesulfonate, triphenylsulfonium trifluoromethanesulfonate, tri(tert-butylphenyl)sulfonium trifluoromethanesulfonate, benzenediazoniumparatoluenesulfonate, 4-(di-n-propylamino)-benzonium tetrafluoroborate, 4-p-tollyl-mercapto-2,5-diethoxybenzenediazonium hexafluorophosphate, diphenylamine-4-diazoniumsulfate, 4-methyl-6-trichloromethyl-2-pyrone, 4-(3,4,5-trimethoxystyryl)-6-trichloromethyl-2-pyrone, 4-(4-methoxystyryl)-6-(3,3,3-trichloropropenyl)-2-pyrone, 2-trichloromethylbenzimidazole, 2-tribromomethylquinoline, 2,4-dimethyl-1-tribromoacetylbenzene, 4-dibromoacetylbenzoic acid, 1,4-bis-dibromomethylbenzene, tris-dibromomethyl-S-triazine, 2-(6-methoxynaphth-2-yl)-4,6-bis-trichloromethyl-S-triazine, 2-(naphth-1-yl)-4,6-bis-trichloromethyl-S-triazine, 2-(naphth-2-yl)-4,6-bis-trichloromethyl-S-triazine, 2-(4-ethoxyethylnaphth-1-yl)-4,6-bis-trichloromethyl-S-triazine, 2-(benzopyran-3-yl)-4,6-bis-trichloromethyl-S-triazine, 2-(4-methoxyanthrasen-1-yl)-4,6-bis-trichloromethyl-S-triazine, 2-(phenanth-9-yl)-4,6-bis-trichloromethyl-S-triazine, and o-naphthoquinonediazido-4-sulfonic acid chloride. Examples of the sulfonate are naphthoquinonediazido-4-sulfonic acid ester, naphthoquinonediazido-5-sulfonic acid ester, o-nitrobenzyl p-toluenesulfonate, and 2,6-dinitrobenzyl p-toluenesulfonate.

The mixing amount of the component (b) is preferably about 0.01 to 50 wt %, and more preferably 0.1 to 10 wt % with respect to the total solid content of the composition. If the mixing amount of the component (b) is smaller than 0.01 wt %, it may become difficult to obtain sufficient photosensitive characteristics. If the mixing amount is greater than 50 wt %, on the other hand, homogeneous resist films may become difficult to form, or a residue may be left behind upon removal performed after pattern formation.

In the photosensitive composition according to the first invention, the component (c) is a compound which increases the miscibility in a resist film. This compound is selected from an imidazole compound, an alanine compound, an adenine compound, an adenosine compound, and a quaternary ammonium salt compound.

The imidazole compound is imidazole or its derivative. Although one practical example of this imidazole compound is a compound represented by Formula (5) below, the imidazole compound is not limited to this example.

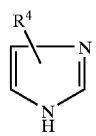

Formula (5)

wherein $R^4$ represents a monovalent organic group.

The alanine compound is alanine or its derivative. One practical example of this alanine compound is a compound represented by Formula (6) below, but the alanine compound is not limited to this example.

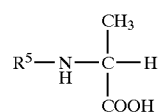

Formula (6)

wherein $R^5$ represents a monovalent organic compound.

The adenine compound is adenine or its derivative. Practical examples of this adenine compound are compounds represented by Formulas (7) and (8) below, but the adenine compound is not limited to these examples.

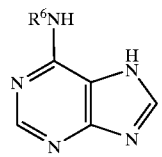

Formula (7)

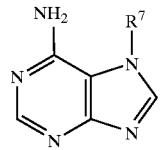

Formula (8)

wherein each of $R^6$ and $R^7$ represents a monovalent organic group.

The adenosine compound is adenosine or its derivative. Although a practical example of this adenosine compound is a compound represented by Formula (9) below, the adenosine compound is not limited to this example.

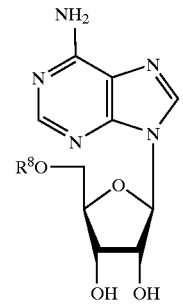

Formula (9)

wherein $R^8$ represents a monovalent organic group.

In compounds represented by Formulas (5) to (9), the monovalent organic group introduced as any of $R^4$, $R^5$, $R^6$, $R^7$, and $R^8$ is not particularly limited. Examples of the monovalent organic group are methyl, ethyl, n-propyl, iso-propyl, n-butyl, tert-butyl, iso-butyl, sec-butyl, and benzyl.

The quaternary ammonium salt compound is a quaternary ammonium salt or its derivative. A practical example of this quaternary ammonium salt compound is a compound represented by Formula (10) below, but the quaternary ammonium salt compound is not limited to this example. In Formula (10), $R^9$ represents a monovalent organic group. X is also a monovalent organic group. Examples of X are hydroxyl group and the like, and a hydroxyl group is preferable.

$$N(R^9)_4 \cdot X$$   Formula (10)

Figure 3A:
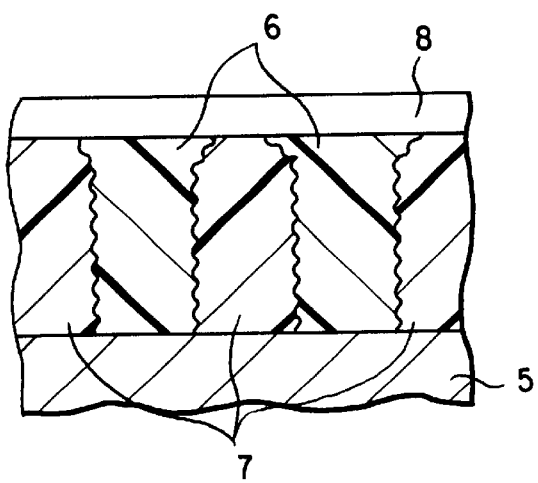
FIGS. 3A and 3B are schematic views showing the shape of a pattern formed by using a conventional photo sensitive composition.
Figure 3B:
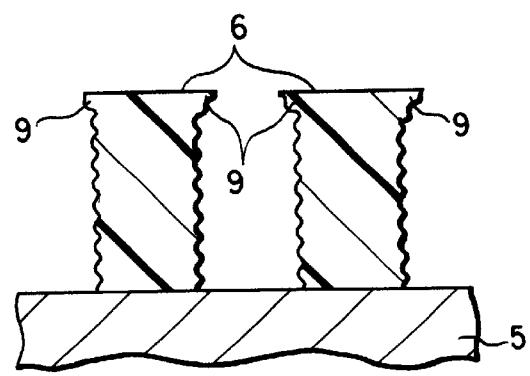

In the photosensitive composition of the first invention, the mixing amount of the component (c) is preferably about 0.01 to 50 wt %, and more preferably 0.1 to 30 wt % with respect to the total solid content of the composition. If the mixing amount of the component (c) is larger than 50 wt %, the distribution of the photo sensitive composition either varies or offsets in the resist film; that is, the miscibility is degraded. If the mixing amount of the component (c) is smaller than 0.01 wt %, a residue may be left behind after development to roughen the surface of the pattern formed. A mixing amount greater than 50 wt %, on the other hand, decreases the difference in dissolution rate with respect to an alkali solution between the exposed and unexposed portions of the resist film, and this may reduce the resolution. Mixing the component (c) makes exposure in the state shown in FIG. 1 possible without using a protective film (denoted by reference numeral 8 in FIG. 3A) which is conventionally required, and this makes the protective film coating step unnecessary.

The second photosensitive composition will be described below.

In the second photosensitive composition, the components (a) and (b) are identical with those discussed earlier.

A phenol compound as the component (d) is a compound having a phenol skeleton, i.e., a phenolic hydroxyl group in its structure. This phenol compound has a lower molecular weight than that of the polymer as the component (a), specifically, the ether or the ester using the polymer having a phenol skeleton as a base polymer.

The phenol compound increases the miscibility between the polymer as the component (a) and the low-molecular-weight compound as compound (b).

Note that the molecular weight of this polymer is preferably about 1,000 or more in order to improve the miscibility between the polymer.

Practical examples of the phenol compound are compounds represented by Formulas (11), (12), and (13) below and polyvinyl phenol represented by Formula (14) below. Of these compounds, particularly a triphenol compound, i.e., a compound having three phenolic hydroxyl groups is preferred. In the case of polyvinylphenol represented by Formula (14), it is preferable that p have a lower molecular weight than that of the base polymer having a phenol skeleton.

Formula (11):

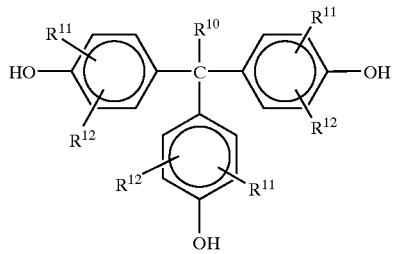

Formula (12):

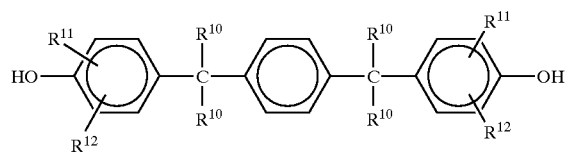

Formula (13):

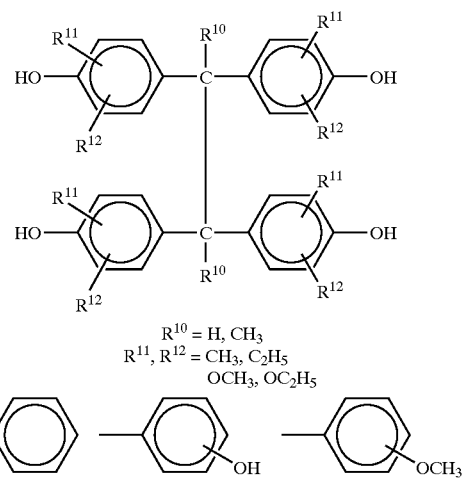

$R^{10} = H, CH_3$
$R^{11}, R^{12} = CH_3, C_2H_5$
$OCH_3, OC_2H_5$

Formula (14):

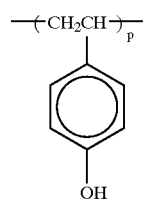

In the second photosensitive composition of the present invention, the mixing amount of the component (d) is preferably about 0.01 to 50 wt %, and more preferably 0.1 to 10 wt % with respect to the total solid content of the composition. If the mixing amount of the component (d) is less than 0.01 wt %, it may become difficult to obtain a satisfactory photosensitive performance. If the mixing amount is more than 50 wt %, it may become difficult to form homogeneous resist films.

Figure 2:
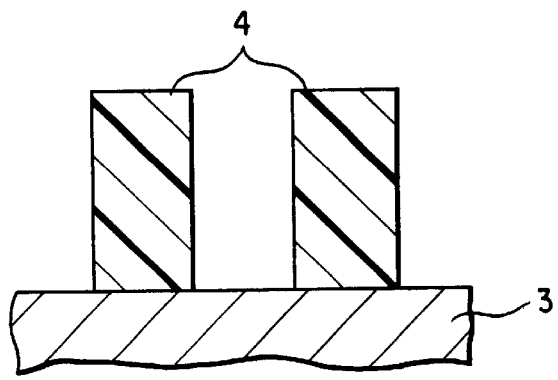
FIG. 2 is a schematic view showing the shape of a pattern formed by using the photosensitive composition of the present invention.

According to the second invention as described above, the addition of the component (d) eliminates the standing-wave effect, and this makes it possible to form a vertical fine pattern as illustrated in FIG. 2. In addition, as in the first invention, the number of manufacturing steps can be decreased since the protective film (8 in FIG. 3A) need not be used.

The photosensitive composition according to the third invention of the present invention contains a phenol compound as the component (d) in addition to the components (a), (b), and (c) of the first composition of the present invention.

The components (a), (b), (c), and (d) are the same as those explained above.

In the photosensitive composition according to the third invention, the mixing amount of the component (d) is preferably about 0.01 to 50 wt %, and more preferably 0.1 to 10 wt % with respect to the total solid content of the composition. If the mixing amount of the component (d) is smaller than 0.1 wt %, it may become difficult to obtain a satisfactory photosensitive performance. If the mixing amount exceeds 50 wt %, homogeneous resist films may become difficult to form.

In the photosensitive composition according to the third invention, it is preferable that the mixing amounts of the components (a), (b), and (c) be 10 to 60 wt %, 0.1 to 10 wt %, and 5 to 50 wt %, respectively.

In addition to the above essential constituents, the photosensitive composition of the present invention may contain a surfactant as a film modifier, a dye as an antireflection agent, and the like, if necessary.

The photosensitive composition of the present invention can be prepared by dissolving the essential components as described above and, if necessary, other additives in an appropriate organic solvent, and filtering the resultant solution. Examples of the organic solvent are a ketone-type solvent, such as cyclohexanone, acetone, methyl ethyl ketone, and methyl isobutyl ketone; a cellosolve-type solvent, such as methylcellosolve, methylcellosolve acetate, ethylcellosolve, ethylcellosolve acetate, butylcellosolve, and butylcellosolve acetate; an ester-type solvent, such as ethyl acetate, butyl acetate, isoamyl acetate, ethyl lactate, and methyl lactate; and N-methyl-2-pyrrolidone, dimethylformamide, dimethylacetamide, and dimethyl sulfoxide. These solvents can be used either singly or in the form of a mixture. These solvents may also contain a proper amount of an aliphatic alcohol, such as xylene, toluene, or isopropyl alcohol.

A formation process of a resist pattern using the photosensitive composition of the present invention will be described below.

First, a solution of a photosensitive composition prepared by dissolving the above components in an organic solvent is coated on a substrate by a spin coating method or a dipping method, and dried at about 150° C. or less, preferably 70 to 120° C., thereby forming a photosensitive resin layer (a resist film) containing the above composition as its main constituent. Examples of the substrate herein used are a silicon wafer, a silicon wafer having steps of various insulating films, electrodes, and interconnections on its surface, a blank mask, and a III–V compound semiconductor wafer consisting of, e.g., GaAs or AlGaAs.

Subsequently, pattern exposure is performed for the resist film. Upon this exposure, the component (b) of the photosensitive composition generates an acid in the exposed portion of the resist film.

As the light source for this exposure, it is possible to use an i-, h-, or g-line of a low-pressure mercury lamp, xenon lamp light, various ultraviolet rays, e.g., deep UV such as a KrF or ArF excimer laser, X-rays, an electron beam, y rays, or an ion beam. When ultraviolet rays or X-rays are to be used, the pattern exposure is performed by selectively exposing the resist film through a predetermined mask pattern. When an electron beam or an ion beam is to be used, on the other hand, the pattern exposure is performed directly on the resist film by scanning the radiation without using any mask. To improve the resolution by lowering the dissolution rate in an unexposed portion, it is also possible to perform fog exposure by which the entire surface of the resist film is exposed while the exposed portion of the pattern is heated.

Subsequently, the resist film thus exposed is heat-treated (baked) by using a hot plate or an oven or by being irradiated with infrared rays. Upon this baking, the acid generated by the exposure diffuses to act on the polymer as the component (a) in the exposed portion of the resist film. This consequently decomposes the introduced protective group, reproducing the alkali-soluble group.

The baking temperature is preferably about 50 to 160° C., and more preferably 70 to 150° C. If the baking temperature is lower than 50° C., there is a possibility that the acid generated by the component (b) cannot react sufficiently with the component (a). If the baking temperature is higher than 160° C., excessive decomposition or hardening may occur across the exposed and unexposed portions of the resist film.

Subsequently, the baked resist film is developed by using an alkali solution in accordance with a dipping process or a spray process. This selectively dissolves away the exposed portion of the resist film, yielding a desired pattern. Examples of the alkali solution herein used as the developing solution are inorganic alkali solutions, such as aqueous solutions of potassium hydroxide, sodium hydroxide, sodium carbonate, sodium silicate, and sodium metasilicate, an aqueous tetramethylammonium hydroxide solution, an aqueous trimethylhydroxyethylammonium hydroxide solution, and solutions prepared by adding an alcohol, a surfactant, and the like to these aqueous solutions. Xylene or isopropylalcohol can be used, for example, as an organic solvent.

The substrate and the resist film (the resist pattern) thus developed are rinsed with water or the like and dried.

In the above process, in order to further improve the heat resistance of the resist pattern, it is possible to perform, after the development, a treatment such as step baking by which the resin component (the polymer as the component (a)) contained in the resist pattern is cross-linked by gradually heating the substrate, or deep UV cure by which the resin component (the polymer as the component (a)) contained in the resist pattern is cross-linked by radiating deep UV while the substrate is heated.

In addition, to decrease the dissolution rate of the alkali solution in the unexposed portion of the resist pattern to thereby improve the contrast between the unexposed and exposed portions, it is possible to dip the resist film into a low-concentration alkali solution either before or after the exposure and then perform development by using an alkali solution with a higher concentration. In this case, the resist film can be dipped in amines, such as triethylamine, triethanolamine, or hexamethyldisilazane, instead of the low-concentration alkali solution, or can be exposed to a vapor of any of these amines. It is also possible to perform a heat treatment for the resist film dipped in the low-concentration alkali solution or exposed to amines.

EXAMPLES

The present invention will be described in more detail below by way of its examples. Note that these examples will be described for easy understanding of the present invention, so the invention is not particularly limited to the examples. Synthesis of polymer to which group unstable with respect to acid is introduced.

A 50 g portion of polyvinylphenol (PHM-C: available from Maruzen Sekiyu Kagaku K. K.) was dissolved in 200 ml of acetone in a four-necked flask, and 17.63 g of potassium carbonate, 8.48 g of potassium iodide, and 24.38 g of tert-butyl bromoacetate were dissolved in the solution. The resultant solution was refluxed under stirring for seven hours. After the undissolved components were removed by filtration, acetone was distilled off, and the residue was dissolved in 150 ml of ethanol. The resultant solution was added dropwise into 1.5 ml of water to precipitate a polymer. The polymer was separated by filtration, washed with 300 ml of water five times, and dried four 12 hours. Subsequently, the dried polymer was again dissolved in 220 ml of ethanol, and precipitation and purification were performed by the same manipulations as described above. The resultant material was dried in a vacuum dryer at 50° C. for 24 hours, thereby obtaining a polymer weighing 52.0 g.

When the obtained polymer was analyzed by a $^1$H-NMR spectrum, it was found that the polymer was a compound in which a 15% portion of all phenolic hydroxyl groups of the polyvinylphenol changed into tert-butoxycarbonyl methyl ether. This polymer was labeled [T-1].

Following the same procedures as described above, eight types of polymers [T-2] to [T-9] different in the substitution ratio of phenolic hydroxyl groups in polyvinylphenol, i.e., different in the introduction ratio of an ether were synthesized by properly adjusting the mixing amounts of potassium carbonate, potassium iodide, and tert-butyl bromoacetate.

The structures and compositions of these polymers are presented in Table 1 below.

EXAMPLES 1–48

(1) Preparation of Photosensitive Compositions Each Consisting of Polymer to which Group Unstable with Respect to Acid was Introduced, Onium Salt, and Amine Compound.

In accordance with the formulations shown in Table 2 below, polymers to each of which a group unstable with respect to an acid was introduced, an onium salt (triphenylsulfoniumtrifulate) as a photo-acid generator, and amine compounds were dissolved in organic solvents. The resultant solutions were filtered through a filter with a pore size of 0.2 μm, thereby preparing photosensitive compositions [R-1] to [R-48] in the form of varnishes.

In the preparation of these photosensitive compositions, an imidazole compound (one of A-1 to A-3) was mixed in the compositions [R-1] to [R-9], an alanine compound (A-4 or A-5) was mixed in the compositions [R-10] to [R-21], an adenine compound (A-6 or A-7) was mixed in the compositions [R-22] to [R-33], an adenosine compound (A-8) was mixed in the compositions [R-34] to [R-39], and a quaternary ammonium salt compound (A-9) was mixed in the compositions [R-40] to [R-48].

The formulas of the imidazole compounds, the alanine compounds, the adenine compounds, the adenosine compound, and the quaternary ammonium salt compound, each represented by a symbol, are presented following these tables.

TABLE 1

Formula and composition of polymer to which group unstable with respect to acid was introduced

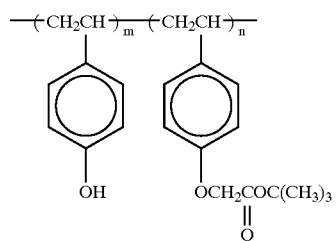

| Symbol of polymer | $m$ (molar ratio) in the above formula | $n$ (molar ratio) in the above formula |
|---|---|---|
| T-1 | 0.85 | 0.15 |
| T-2 | 0.80 | 0.20 |
| T-3 | 0.80 | 0.20 |
| T-4 | 0.79 | 0.21 |
| T-5 | 0.75 | 0.25 |
| T-6 | 0.67 | 0.33 |
| T-7 | 0.62 | 0.38 |
| T-8 | 0.50 | 0.50 |
| T-9 | 0.81 | 0.19 |

TABLE 2

Preparation of photosensitive compositions

| Example No. | Symbol of photo-sensitive composition | Polymer to which group unstable with respect to acid was introduced* (mixing amount) | Mixing amount of onium salt | Component (C) (mixing amount) | Organic solvent (mixing amount) |
|---|---|---|---|---|---|
| 1 | R-1 | T-2 (2.0 g) | 30 mg | A-1 (2.09 mg) | Ethylcellosolve acetate (6.0 g) |
| 2 | R-2 | T-2 (2.0 g) | 30 mg | A-2 (1.39 mg) | Ethylcellosolve acetate (6.0 g) |
| 3 | R-3 | T-2 (2.0 g) | 30 mg | A-3 (4.31 mg) | Ethylcellosolve acetate (6.0 g) |
| 4 | R-4 | T-4 (2.0 g) | 40 mg | A-1 (1.39 mg) | Ethylcellosolve acetate (6.0 g) |
| 5 | R-5 | T-4 (2.0 g) | 40 mg | A-2 (0.93 mg) | Ethylcellosolve acetate (6.0 g) |
| 6 | R-6 | T-4 (2.0 g) | 40 mg | A-3 (2.87 mg) | Ethylcellosolve acetate (6.0 g) |
| 7 | R-7 | T-4 (2.0 g) | 40 mg | A-3 (5.74 mg) | Ethylcellosolve acetate (6.0 g) |
| 8 | R-8 | T-4 (2.0 g) | 40 mg | A-3 (5.74 mg) | Ethylcellosolve acetate (6.0 g) |
| 9 | R-9 | T-4 (2.0 g) | 60 mg | A-3 (12.93 mg) | Ethylcellosolve acetate (6.0 g) |
| 10 | R-10 | T-5 (2.0 g) | 30 mg | A-4 (0.65 mg) | Methylmethoxy propionate (6.00 g) |
| 11 | R-11 | T-5 (2.0 g) | 30 mg | A-4 (0.97 mg) | Methylmethoxy propionate (6.00 g) |
| 12 | R-12 | T-5 (2.0 g) | 30 mg | A-4 (1.30 mg) | Methylmethoxy propionate (6.00 g) |
| 13 | R-13 | T-5 (2.0 g) | 40 mg | A-4 (0.86 mg) | Methylmethoxy propionate (6.00 g) |
| 14 | R-14 | T-5 (2.0 g) | 40 mg | A-4 (1.30 mg) | Methylmethoxy propionate (6.00 g) |

TABLE 2-continued

Preparation of photosensitive compositions

| Example No. | Symbol of photo-sensitive composition | Polymer to which group unstable with respect to acid was introduced* (mixing amount) | Mixing amount of onium salt | Component (C) (mixing amount) | Organic solvent (mixing amount) |
|---|---|---|---|---|---|
| 15 | R-15 | T-5 (2.0 g) | 40 mg | A-4 (1.73 mg) | Methylmethoxy propionate (6.00 g) |
| 16 | R-16 | T-5 (2.0 g) | 40 mg | A-5 (1.41 mg) | Methylmethoxy propionate (6.00 g) |
| 17 | R-17 | T-5 (2.0 g) | 40 mg | A-5 (2.11 mg) | Methylmethoxy propionate (6.00 g) |
| 18 | R-18 | T-5 (2.0 g) | 40 mg | A-5 (2.81 mg) | Methylmethoxy propionate (6.00 g) |
| 19 | R-19 | T-5 (2.0 g) | 40 mg | A-5 (1.87 mg) | Methylmethoxy propionate (6.00 g) |
| 20 | R-20 | T-5 (2.0 g) | 40 mg | A-5 (2.81 mg) | Methylmethoxy propionate (6.00 g) |
| 21 | R-21 | T-5 (2.0 g) | 40 mg | A-5 (3.75 mg) | Methylmethoxy propionate (6.00 g) |
| 22 | R-22 | T-5 (2.0 g) | 30 mg | A-6 (0.98 mg) | Methylmethoxy propionate (6.00 g) |
| 23 | R-23 | T-5 (2.0 g) | 30 mg | A-6 (1.47 mg) | Methylmethoxy propionate (6.00 g) |
| 24 | R-24 | T-5 (2.0 g) | 30 mg | A-6 (1.95 mg) | Methylmethoxy propionate (6.00 g) |
| 25 | R-25 | T-5 (2.0 g) | 40 mg | A-6 (1.31 mg) | Methylmethoxy propionate (6.00 g) |
| 26 | R-26 | T-5 (2.0 g) | 40 mg | A-6 (1.96 mg) | Methylmethoxy propionate (6.00 g) |
| 27 | R-27 | T-5 (2.0 g) | 40 mg | A-6 (2.62 mg) | Methylmethoxy propionate (6.00 g) |
| 28 | R-28 | T-5 (2.0 g) | 30 mg | A-7 (1.64 mg) | Methylmethoxy propionate (6.00 g) |
| 29 | R-29 | T-5 (2.0 g) | 30 mg | A-7 (2.46 mg) | Methylmethoxy propionate (6.00 g) |
| 30 | R-30 | T-5 (2.0 g) | 30 mg | A-7 (3.28 mg) | Methylmethoxy propionate (6.00 g) |
| 31 | R-31 | T-5 (2.0 g) | 40 mg | A-7 (2.18 mg) | Methylmethoxy propionate (6.00 g) |
| 32 | R-32 | T-5 (2.0 g) | 40 mg | A-7 (3.28 mg) | Methylmethoxy propionate (6.00 g) |
| 33 | R-33 | T-5 (2.0 g) | 40 mg | A-7 (4.37 mg) | Methylmethoxy propionate (6.00 g) |
| 34 | R-34 | T-5 (2.0 g) | 30 mg | A-8 (1.94 mg) | Methylmethoxy propionate (6.00 g) |
| 35 | R-35 | T-5 (2.0 g) | 30 mg | A-8 (2.92 mg) | Methylmethoxy propionate (6.00 g) |
| 36 | R-36 | T-5 (2.0 g) | 30 mg | A-8 (3.89 mg) | Methylmethoxy propionate (6.00 g) |
| 37 | R-37 | T-5 (2.0 g) | 40 mg | A-8 (2.59 mg) | Methylmethoxy propionate (6.00 g) |
| 38 | R-38 | T-5 (2.0 g) | 40 mg | A-8 (3.89 mg) | Methylmethoxy propionate (6.00 g) |
| 39 | R-39 | T-5 (2.0 g) | 40 mg | A-8 (5.18 mg) | Methylmethoxy propionate (6.00 g) |
| 40 | R-40 | T-1 (2.0 g) | 40 mg | A-9 (0.88 mg) | Methylmethoxy propionate (6.00 g) |
| 41 | R-41 | T-1 (2.0 g) | 40 mg | A-9 (1.76 mg) | Methylmethoxy propionate (6.00 g) |
| 42 | R-42 | T-1 (2.0 g) | 40 mg | A-9 (2.65 mg) | Methylmethoxy propionate (6.00 g) |
| 43 | R-43 | T-1 (2.0 g) | 50 mg | A-9 (1.11 mg) | Methylmethoxy propionate (6.00 g) |
| 44 | R-44 | T-1 (2.0 g) | 50 mg | A-9 (2.21 mg) | Methylmethoxy propionate (6.00 g) |
| 45 | R-45 | T-1 (2.0 g) | 50 mg | A-9 (3.32 mg) | Methylmethoxy propionate (6.00 g) |
| 46 | R-46 | T-4 (2.0 g) | 60 mg | A-9 (1.32 mg) | Methylmethoxy propionate (6.00 g) |

TABLE 2-continued

Preparation of photosensitive compositions

| Example No. | Symbol of photo-sensitive composition | Polymer to which group unstable with respect to acid was introduced* (mixing amount) | Mixing amount of onium salt | Component (C) (mixing amount) | Organic solvent (mixing amount) |
|---|---|---|---|---|---|
| 47 | R-47 | T-4 (2.0 g) | 60 mg | A-9 (2.65 mg) | Methylmethoxy propionate (6.00 g) |
| 48 | R-48 | T-4 (2.0 g) | 60 mg | A-9 (3.98 mg) | Methylmethoxy propionate (6.00 g) |

*See Table 1

(A-1):

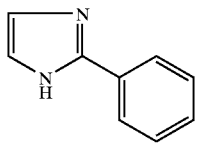

(A-2):

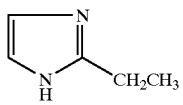

(A-3):

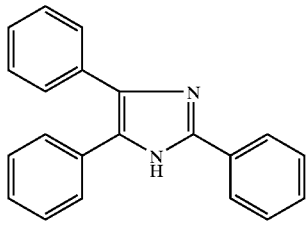

(A-4):

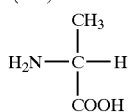

(A-5):

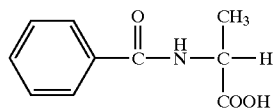

(A-6):

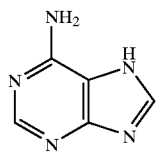

(A-7):

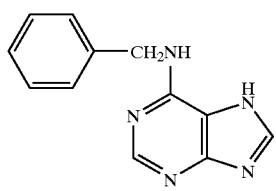

TABLE 2-continued

Preparation of photosensitive compositions

| Example No. | Symbol of photo-sensitive composition | Polymer to which group unstable with respect to acid was introduced* (mixing amount) | Mixing amount of onium salt | Component (C) (mixing amount) | Organic solvent (mixing amount) |
|---|---|---|---|---|---|

(A-8):

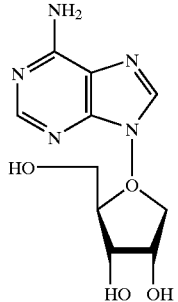

(A-9): $(CH_3)_4N \cdot OH$ (2) Formation of Patterns

Each of the photosensitive compositions (varnishes) prepared as described above was spin-coated on a 6-inch silicon wafer. The resultant wafer was prebaked on a hot plate at 95° C. for 90 seconds, thereby forming a 1.0-$\mu$m thick photosensitive composition film (a resist film). Subsequently, pattern exposure was performed on the resist film by using a KrF excimer laser stepper, and the resultant wafer was baked on a hot plate at 95° C. for 90 seconds. The baked wafer was then dipped in a 1.59% aqueous tetramethylammonium hydroxide solution (an aqueous TMAH solution) for 20 seconds, thereby developing the resist film.

Thereafter, the resultant wafer was washed and dried to obtain a pattern consisting of lines and spaces.

The sectional shape of each resultant pattern was observed by using a scanning electron microscope to thereby measure the widths of the lines and the spaces, as a measure of the resolution.

Table 3 below shows the exposure amount (the sensitivity) and the resolution of the photosensitive composition obtained in each example.

Note that the alkali solution was used as the developing solution in these examples, but the developing solution is not limited to the alkali solution. For example, the development can be performed by using another alkali solution or an organic solvent.

TABLE 3

Formation of patterns

| Example | Symbol of photo-sensitive composition | Prebaking conditions | Exposure amount (mJ/cm$^2$) | Baking conditions after exposure | Resolution ($\mu$m) |
|---|---|---|---|---|---|
| 1 | R-1 | 95° C. 90 sec | 12 | 95° C. 90 sec | 0.275 |
| 2 | R-2 | " | 16 | " | 0.275 |
| 3 | R-3 | " | 24 | " | 0.275 |
| 4 | R-4 | " | 12 | " | 0.275 |
| 5 | R-5 | " | 6 | " | 0.30 |
| 6 | R-6 | " | 14 | " | 0.25 |
| 7 | R-7 | " | 14 | " | 0.275 |
| 8 | R-8 | " | 15 | " | 0.275 |
| 9 | R-9 | " | 12 | " | 0.275 |
| 10 | R-10 | " | 23 | " | 0.30 |
| 11 | R-11 | " | 25 | " | 0.275 |
| 12 | R-12 | " | 24 | " | 0.30 |
| 13 | R-13 | " | 21 | " | 0.30 |
| 14 | R-14 | " | 20 | " | 0.275 |
| 15 | R-15 | " | 22 | " | 0.275 |
| 16 | R-16 | " | 22 | " | 0.30 |
| 17 | R-17 | " | 20 | " | 0.275 |
| 18 | R-18 | " | 18 | " | 0.275 |
| 19 | R-19 | " | 16 | " | 0.275 |
| 20 | R-20 | " | 21 | " | 0.275 |
| 21 | R-21 | " | 19 | " | 0.275 |
| 22 | R-22 | " | 32 | " | 0.35 |
| 23 | R-23 | " | 36 | " | 0.275 |
| 24 | R-24 | " | 34 | " | 0.30 |
| 25 | R-25 | " | 33 | " | 0.275 |

TABLE 3-continued

Formation of patterns

| Example | Symbol of photo-sensitive composition | Prebaking conditions | Exposure amount (mJ/cm²) | Baking conditions after exposure | Resolution (μm) |
|---|---|---|---|---|---|
| 26 | R-26 | " | 35 | " | 0.275 |
| 27 | R-27 | " | 39 | " | 0.30 |
| 28 | R-28 | " | 37 | " | 0.30 |
| 29 | R-29 | " | 38 | " | 0.275 |
| 30 | R-30 | " | 40 | " | 0.275 |
| 31 | R-31 | " | 37 | " | 0.30 |
| 32 | R-32 | " | 39 | " | 0.275 |
| 33 | R-33 | " | 41 | " | 0.275 |
| 34 | R-34 | " | 32 | " | 0.30 |
| 35 | R-35 | " | 35 | " | 0.275 |
| 36 | R-36 | " | 39 | " | 0.275 |
| 37 | R-37 | " | 37 | " | 0.275 |
| 38 | R-38 | " | 38 | " | 0.275 |
| 39 | R-39 | " | 41 | " | 0.275 |
| 40 | R-40 | " | 35 | " | 0.275 |
| 41 | R-41 | " | " | " | 0.3 |
| 42 | R-42 | " | " | " | 0.35 |
| 43 | R-43 | " | " | " | 0.3 |
| 44 | R-44 | " | " | " | 0.3 |
| 45 | R-45 | " | " | " | 0.35 |
| 46 | R-46 | " | " | " | 0.3 |
| 47 | R-47 | " | " | " | 0.3 |
| 48 | R-48 | " | " | " | 0.3 |

As is apparent from the above results, each photo sensitive composition of the present invention had a high sensitivity and a high resolution. In addition, any of the patterns resulting from the compositions of the present invention had a rectangular sectional shape and a steep side surface in a line portion.

Also, when the patterns were formed by using the compositions [R-1] to [R-48], it was possible to reduce or eliminate the formation of an overhang-like solubility-retarded layer on the resist surface as shown in FIG. 1. Consequently, the pattern formation could be done without forming any protective film on the resist film.

EXAMPLES 49–62

(1) Preparation of Photosensitive Compositions Each Consisting of Polymer to Which Group Unstable with Respect to Acid was Introduced, Onium Salt, and Phenol Compound.

In accordance with the formulations given in Table 4 below, polymers to each of which a group unstable with respect to an acid was introduced, an onium salt (triphenylsulfoniumtrifulate) as a photo-acid generator, and phenol compounds were dissolved in organic solvents. The resultant solutions were filtered through a filter with a pore size of 0.2 μm, thereby preparing photosensitive compositions [R-49] to [R-62] in the form of varnishes.

In the preparation of these photosensitive compositions, a phenol compound (one of P-1 to P-7) was mixed in the compositions [R-49] to [R-62].

The formulas of the phenol compounds represented by the symbols are presented following the table.

TABLE 4

Preparation of photosensitive compositions

| Example No. | Symbol of photo-sensitive composition | Polymer to which group unstable with respect to acid was introduced* (mixing amount) | Mixing amount of onium salt | Phenol compound (mixing amount) | Organic solvent (mixing amount) |
|---|---|---|---|---|---|
| 49 | R-49 | T-1 (2.0 g) | 40 mg | P-1 (60 mg) | Ethylcellosolve acetate (6.0 g) |
| 50 | R-50 | T-1 (2.0 g) | 40 mg | P-2 (60 mg) | Ethylcellosolve acetate (6.0 g) |
| 51 | R-51 | T-1 (2.0 g) | 40 mg | P-3 (60 mg) | Ethylcellosolve acetate (6.0 g) |
| 52 | R-52 | T-1 (2.0 g) | 40 mg | P-4 (60 mg) | Ethylcellosolve acetate (6.0 g) |
| 53 | R-53 | T-1 (1.5 g) | 30 mg | P-5 (45 mg) | Ethylcellosolve acetate (6.0 g) |
| 54 | R-54 | T-1 (1.5 g) | 30 mg | P-6 (45 mg) | Ethylcellosolve acetate (6.0 g) |
| 55 | R-55 | T-1 (1.5 g) | 30 mg | P-7 (45 mg) | Ethylcellosolve acetate (6.0 g) |

TABLE 4-continued

Preparation of photosensitive compositions

| Example No. | Symbol of photo-sensitive composition | Polymer to which group unstable with respect to acid was introduced* (mixing amount) | Mixing amount of onium salt | Phenol compound (mixing amount) | Organic solvent (mixing amount) |
|---|---|---|---|---|---|
| 56 | R-56 | T-9 (2.0 g) | 10 mg | P-1 (10 mg) | Ethylcellosolve acetate (6.0 g) |
| 57 | R-57 | T-9 (2.0 g) | 10 mg | P-2 (10 mg) | Ethylcellosolve acetate (6.0 g) |
| 58 | R-58 | T-9 (2.0 g) | 10 mg | P-3 (10 mg) | Ethylcellosolve acetate (6.0 g) |
| 59 | R-59 | T-9 (2.0 g) | 10 mg | P-4 (10 mg) | Ethylcellosolve acetate (6.0 g) |
| 60 | R-60 | T-9 (2.0 g) | 10 mg | P-5 (10 mg) | Ethylcellosolve acetate (6.0 g) |
| 61 | R-61 | T-9 (2.0 g) | 10 mg | P-6 (10 mg) | Ethylcellosolve acetate (6.0 g) |
| 62 | R-62 | T-9 (2.0 g) | 10 mg | P-7 (10 mg) | Ethylcellosolve acetate (6.0 g) |

*See Table 1

(P-1):

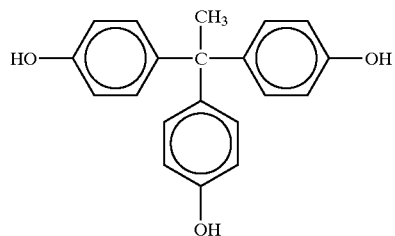

(P-2):

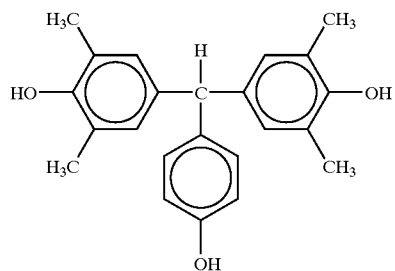

TABLE 4-continued
Preparation of photosensitive compositions
| Example No. | Symbol of photo-sensitive composition | Polymer to which group unstable with respect to acid was introduced* (mixing amount) | Mixing amount of onium salt | Phenol compound (mixing amount) | Organic solvent (mixing amount) |
|---|---|---|---|---|---|
(P-3):
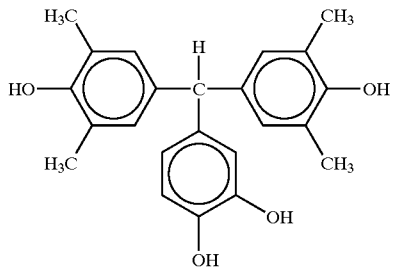
(P-4):
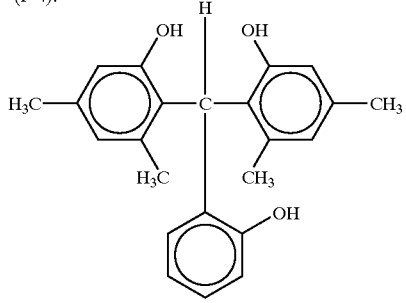
(P-5):
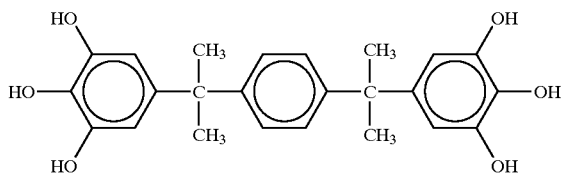
(P-6):
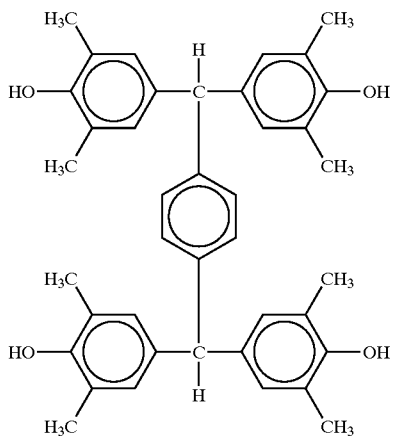

TABLE 4-continued

Preparation of photosensitive compositions

| Example No. | Symbol of photo-sensitive composition | Polymer to which group unstable with respect to acid was introduced* (mixing amount) | Mixing amount of onium salt | Phenol compound (mixing amount) | Organic solvent (mixing amount) |
|---|---|---|---|---|---|

(P-7):

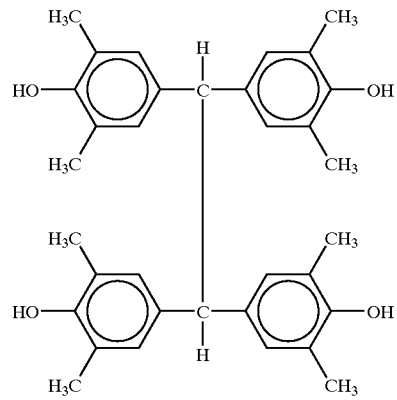

(2) Formation of Patterns

Each of the photosensitive compositions (varnishes) prepared as described above was spin-coated on a 6-inch silicon wafer. The resultant wafer was prebaked on a hot plate at 95° C. for 90 seconds, thereby forming a 1.0-μm thick photosensitive composition film (a resist film). Subsequently, pattern exposure was performed on the resist film by using a KrF excimer laser stepper, and the resultant wafer was baked on a hot plate at 95° C. for 90 seconds. The baked wafer was then dipped in a 1.59% aqueous tetramethylammonium hydroxide solution (an aqueous TMAH solution) for 20 seconds, thereby developing the resist film. Thereafter, the resultant wafer was washed and dried to obtain a pattern consisting of lines and spaces.

The sectional shape of each resultant pattern was observed by using a scanning electron microscope to thereby measure the widths of the lines and the spaces, as a measure of the resolution.

Table 5 below shows the exposure amount (the sensitivity) and the resolution of the photosensitive composition obtained in each example.

TABLE 5

Formation of patterns

| Example | Symbol of photo-sensitive composition | Prebaking conditions | Exposure amount (mJ/cm$^2$) | Baking conditions after exposure | Resolution (μm) |
|---|---|---|---|---|---|
| 49 | R-49 | 95° C. 90 sec | 42 | 95° C. 90 sec | 0.35 |
| 50 | R-50 | " | 40 | " | 0.30 |
| 51 | R-51 | " | 41 | " | 0.30 |
| 52 | R-52 | " | 43 | " | 0.35 |
| 53 | R-53 | " | 46 | " | 0.30 |
| 54 | R-54 | " | 44 | " | 0.30 |
| 55 | R-55 | " | 43 | " | 0.30 |
| 56 | R-56 | " | 50 | " | 0.35 |
| 57 | R-57 | " | 45 | " | 0.35 |
| 58 | R-58 | " | 42 | " | 0.35 |
| 59 | R-59 | " | 41 | " | 0.35 |
| 60 | R-60 | " | 47 | " | 0.30 |
| 61 | R-61 | " | 44 | " | 0.30 |
| 62 | R-62 | " | 43 | " | 0.30 |

As is apparent from the above results, each photosensitive composition of the present invention had a high sensitivity and a high resolution. In addition, any of the patterns resulting from the compositions of the present invention had a rectangular sectional shape and a steep side surface in a line portion.

Also, when the patterns were formed by using the compositions [R-49) to [R-62], it was possible to reduce or eliminate the formation of an overhang-like solubility-retarded layer on the resist surface as shown in FIG. 1. Consequently, the pattern formation could be done without forming any protective film on the resist film.

Examples 63–169

(1) Preparation of Photosensitive Compositions Each Consisting of Polymer to which Group Unstable with Respect to Acid was Introduced, Onium Salt, Amine Compound, and Phenol Compound.

In accordance with the formulations shown in Table 6 below, polymers to each of which a group unstable with respect to an acid was introduced, an onium salt (triphenylsulfoniumtrifulate) as a photo-acid generator, compounds for increasing the miscibility in a resist film, and phenol compounds were dissolved in organic solvents. The resultant solutions were filtered through a filter with a pore size of 0.2 μm, thereby preparing photosensitive compositions [R-63] to [R-169] in the form of varnishes.

In the preparation of these photosensitive compositions, the compounds (P-1 to P-7) used in Examples 49 to 62 and the following compound (P-8) were used as the phenol compounds. Note that polyvinylphenol with a molecular weight of approximately 6,000 was used as the compound (P-8). As the amine compounds for increasing the miscibility in a resist film, the imidazole compound (A-1) was used in the compositions [R-63] to [R-82], another imidazole compound was used in the compositions [R-83] to [R-91], the alanine compound (A-4) was used in the compositions [R-92] to [R-111], the adenine compound (A-6 or A-7) was used in the compositions [R-112] to [R-131], the adenosine compound (A-8) was used in the compositions [R-132] to [R-151), and the quaternary ammonium salt compound (A-9) was used in the compositions [R-152] to [R-169].

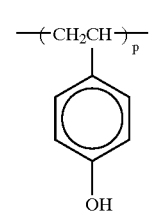

Formula (P-8):

TABLE 6

Preparation of photosensitive compositions

| Example No. | Symbol of photo-sensitive composition | Polymer to which group unstable with respect to acid was introduced* (mixing amount) | Mixing amount of onium salt | Component (C) (mixing amount) | Phenol compound (mixing amount) | Organic solvent (mixing amount) |
|---|---|---|---|---|---|---|
| 63 | R-63 | T-1 (2.0 g) | 60 mg | A-1 (3.47 mg) | P-1 (20 mg) | Ethylcellosolve acetate (6.0 g) |
| 64 | R-64 | T-1 (2.0 g) | 60 mg | A-1 (1.98 mg) | P-1 (20 mg) | Ethylcellosolve acetate (6.0 g) |
| 65 | R-65 | T-1 (2.0 g) | 60 mg | A-1 (0.99 mg) | P-1 (20 mg) | Ethylcellosolve acetate (6.0 g) |
| 66 | R-66 | T-1 (2.0 g) | 60 mg | A-1 (3.47 mg) | P-1 (20 mg) | Methylmethoxy propionate (6.0 g) |
| 67 | R-67 | T-1 (2.0 g) | 60 mg | A-1 (1.98 mg) | P-1 (20 mg) | Methylmethoxy propionate (6.0 g) |
| 68 | R-68 | T-1 (2.0 g) | 60 mg | A-1 (0.99 mg) | P-1 (20 mg) | Methylmethoxy propionate (6.0 g) |
| 69 | R-69 | T-4 (2.0 g) | 60 mg | A-1 (3.47 mg) | P-1 (20 mg) | Ethylcellosolve acetate (6.0 g) |
| 70 | R-70 | T-4 (2.0 g) | 60 mg | A-1 (1.98 mg) | P-1 (20 mg) | Ethylcellosolve acetate (6.0 g) |
| 71 | R-71 | T-4 (2.0 g) | 60 mg | A-1 (3.47 mg) | P-1 (20 mg) | Methylmethoxy propionate (6.0 g) |
| 72 | R-72 | T-4 (2.0 g) | 60 mg | A-1 (1.98 mg) | P-1 (20 mg) | Methylmethoxy propionate (6.0 g) |
| 73 | R-73 | T-1 (2.0 g) | 60 mg | A-1 (3.47 mg) | P-8 (20 mg) | Ethylcellosolve acetate (6.0 g) |
| 74 | R-74 | T-1 (2.0 g) | 60 mg | A-1 (1.98 mg) | P-8 (20 mg) | Ethylcellosolve acetate (6.0 g) |
| 75 | R-75 | T-1 (2.0 g) | 60 mg | A-1 (0.99 mg) | P-8 (20 mg) | Ethylcellosolve acetate (6.0 g) |
| 76 | R-76 | T-1 (2.0 g) | 60 mg | A-1 (3.47 mg) | P-8 (20 mg) | Methylmethoxy propionate (6.0 g) |
| 77 | R-77 | T-1 (2.0 g) | 60 mg | A-1 (1.98 mg) | P-8 (20 mg) | Methylmethoxy propionate (6.0 g) |
| 78 | R-78 | T-1 (2.0 g) | 60 mg | A-1 (0.99 mg) | P-8 (20 mg) | Methylmethoxy propionate (6.0 g) |
| 79 | R-79 | T-4 (2.0 g) | 60 mg | A-1 (3.47 mg) | P-8 (20 mg) | Ethylcellosolve acetate (6.0 g) |
| 80 | R-80 | T-4 (2.0 g) | 60 mg | A-1 (1.98 mg) | P-8 (20 mg) | Ethylcellosolve acetate (6.0 g) |
| 81 | R-81 | T-4 (2.0 g) | 60 mg | A-1 (3.47 mg) | P-8 (20 mg) | Methylmethoxy propionate (6.0 g) |
| 82 | R-82 | T-4 (2.0 g) | 60 mg | A-1 (1.98 mg) | P-8 (20 mg) | Methylmethoxy propionate (6.0 g) |
| 83 | R-83 | T-9 (2.0 g) | 20 mg | A-3 (1.44 mg) | P-1 (20 mg) | Ethylcellosolve acetate (6.0 g) |

TABLE 6-continued

Preparation of photosensitive compositions

| Example No. | Symbol of photo-sensitive composition | Polymer to which group unstable with respect to acid was introduced* (mixing amount) | Mixing amount of onium salt | Component (C) (mixing amount) | Phenol compound (mixing amount) | Organic solvent (mixing amount) |
|---|---|---|---|---|---|---|
| 84 | R-84 | T-9 (2.0 g) | 20 mg | A-3 (2.87 mg) | P-1 (20 mg) | Ethylcellosolve acetate (6.0 g) |
| 85 | R-85 | T-9 (2.0 g) | 20 mg | A-3 (4.31 mg) | P-1 (20 mg) | Ethylcellosolve acetate (6.0 g) |
| 86 | R-86 | T-9 (2.0 g) | 40 mg | A-3 (2.87 mg) | P-1 (20 mg) | Ethylcellosolve acetate (6.0 g) |
| 87 | R-87 | T-9 (2.0 g) | 40 mg | A-3 (5.75 mg) | P-1 (20 mg) | Ethylcellosolve acetate (6.0 g) |
| 88 | R-88 | T-9 (2.0 g) | 40 mg | A-3 (8.62 mg) | P-1 (20 mg) | Ethylcellosolve acetate (6.0 g) |
| 89 | R-89 | T-9 (2.0 g) | 40 mg | A-3 (2.87 mg) | P-1 (20 mg) | Ethylcellosolve acetate (6.0 g) |
| 90 | R-90 | T-9 (2.0 g) | 40 mg | A-3 (2.87 mg) | P-1 (20 mg) | Ethylcellosolve acetate (6.0 g) |
| 91 | R-91 | T-9 (2.0 g) | 40 mg | A-3 (2.87-mg) | P-1 (20 mg) | Ethylcellosolve acetate (6.0 g) |
| 92 | R-92 | T-1 (2.0 g) | 60 mg | A-4 (4.54 mg) | P-1 (20 mg) | Ethylcellosolve acetate (6.0 g) |
| 93 | R-93 | T-1 (2.0 g) | 60 mg | A-4 (2.59 mg) | P-1 (20 mg) | Ethylcellosolve acetate (6.0 g) |
| 94 | R-94 | T-1 (2.0 g) | 60 mg | A-4 (1.30 mg) | P-1 (20 mg) | Ethylcellosolve acetate (6.0 g) |
| 95 | R-95 | T-1 (2.0 g) | 60 mg | A-4 (4.54 mg) | P-1 (20 mg) | Methylmethoxy propionate (6.0 g) |
| 96 | R-96 | T-1 (2.0 g) | 60 mg | A-4 (2.59 mg) | P-1 (20 mg) | Methylmethoxy propionate (6.0 g) |
| 97 | R-97 | T-1 (2.0 g) | 60 mg | A-4 (1.30 mg) | P-1 (20 mg) | Methylmethoxy propionate (6.0 g) |
| 98 | R-98 | T-4 (2.0 g) | 60 mg | A-4 (4.54 mg) | P-1 (20 mg) | Ethylcellosolve acetate (6.0 g) |
| 99 | R-99 | T-4 (2.0 g) | 60 mg | A-4 (2.59 mg) | P-1 (20 mg) | Ethylcellosolve acetate (6.0 g) |
| 100 | R-100 | T-4 (2.0 g) | 60 mg | A-4 (4.54 mg) | P-1 (20 mg) | Methylmethoxy propionate (6.0 g) |
| 101 | R-101 | T-4 (2.0 g) | 60 mg | A-4 (2.59 mg) | P-1 (20 mg) | Methylmethoxy propionate (6.0 g) |
| 102 | R-102 | T-1 (2.0 g) | 60 mg | A-4 (4.54 mg) | P-8 (20 mg) | Ethylcellosolve acetate (6.0 g) |
| 103 | R-103 | T-1 (2.0 g) | 60 mg | A-4 (2.59 mg) | P-8 (20 mg) | Ethylcellosolve acetate (6.0 g) |
| 104 | R-104 | T-1 (2.0 g) | 60 mg | A-4 (1.30 mg) | P-8 (20 mg) | Ethylcellosolve acetate (6.0 g) |
| 105 | R-105 | T-1 (2.0 g) | 60 mg | A-4 (4.54 mg) | P-8 (20 mg) | Methylmethoxy propionate (6.0 g) |
| 106 | R-106 | T-1 (2.0 g) | 60 mg | A-4 (2.59 mg) | P-8 (20 mg) | Methylmethoxy propionate (6.0 g) |
| 107 | R-107 | T-1 (2.0 g) | 60 mg | A-4 (1.39 mg) | P-8 (20 mg) | Methylmethoxy propionate (6.0 g) |
| 108 | R-108 | T-4 (2.0 g) | 60 mg | A-4 (4.54 mg) | P-8 (20 mg) | Ethylcellosolve acetate (6.0 g) |
| 109 | R-109 | T-4 (2.0 g) | 60 mg | A-4 (2.59 mg) | P-8 (20 mg) | Ethylcellosolve acetate (6.0 g) |
| 110 | R-110 | T-4 (2.0 g) | 60 mg | A-4 (4.54 mg) | P-8 (20 mg) | Methylmethoxy propionate (6.0 g) |
| 111 | R-111 | T-4 (2.0 g) | 60 mg | A-4 (2.59 mg) | P-8 (20 mg) | Methylmethoxy propionate (6.0 g) |
| 112 | R-112 | T-1 (2.0 g) | 60 mg | A-6 (6.88 mg) | P-1 (20 mg) | Ethylcellosolve acetate (6.0 g) |
| 113 | R-113 | T-1 (2.0 g) | 60 mg | A-6 (3.93 mg) | P-1 (20 mg) | Ethylcellosolve acetate (6.0 g) |
| 114 | R-114 | T-1 (2.0 g) | 60 mg | A-6 (1.96 mg) | P-1 (20 mg) | Ethylcellosolve acetate (6.0 g) |
| 115 | R-115 | T-1 (2.0 g) | 60 mg | A-6 (6.88 mg) | P-1 (20 mg) | Methylmethoxy propionate (6.0 g) |
| 116 | R-116 | T-1 (2.0 g) | 60 mg | A-6 (3.93 mg) | P-1 (20 mg) | Methylmethoxy propionate (6.0 g) |
| 117 | R-117 | T-1 (2.0 g) | 60 mg | A-6 (1.96 mg) | P-1 (20 mg) | Methylmethoxy propionate (6.0 g) |
| 118 | R-118 | T-4 (2.0 g) | 60 mg | A-6 (6.88 mg) | P-1 (20 mg) | Ethylcellosolve acetate (6.0 g) |

TABLE 6-continued

Preparation of photosensitive compositions

| Example No. | Symbol of photo-sensitive composition | Polymer to which group unstable with respect to acid was introduced* (mixing amount) | Mixing amount of onium salt | Component (C) (mixing amount) | Phenol compound (mixing amount) | Organic solvent (mixing amount) |
|---|---|---|---|---|---|---|
| 119 | R-119 | T-4 (2.0 g) | 60 mg | A-6 (3.93 mg) | P-1 (20 mg) | Ethylcellosolve acetate (6.0 g) |
| 120 | R-120 | T-4 (2.0 g) | 60 mg | A-6 (6.88 mg) | P-1 (20 mg) | Methylmethoxy propionate (6.0 g) |
| 121 | R-121 | T-4 (2.0 g) | 60 mg | A-6 (3.93 mg) | P-1 (20 mg) | Methylmethoxy propionate (6.0 g) |
| 122 | R-122 | T-1 (2.0 g) | 60 mg | A-7 (9.20 mg) | P-8 (20 mg) | Ethylcellosolve acetate (6.0 g) |
| 123 | R-123 | T-1 (2.0 g) | 60 mg | A-7 (6.13 mg) | P-8 (20 mg) | Ethylcellosolve acetate (6.0 g) |
| 124 | R-124 | T-1 (2.0 g) | 60 mg | A-7 (3.06 mg) | P-8 (20 mg) | Ethylcellosolve acetate (6.0 g) |
| 125 | R-125 | T-1 (2.0 g) | 60 mg | A-7 (9.20 mg) | P-8 (20 mg) | Methylmethoxy propionate (6.0 g) |
| 126 | R-126 | T-1 (2.0 g) | 60 mg | A-7 (6.13 mg) | P-8 (20 mg) | Methylmethoxy propionate (6.0 g) |
| 127 | R-127 | T-1 (2.0 g) | 60 mg | A-7 (3.06 mg) | P-8 (20 mg) | Methylmethoxy propionate (6.0 g) |
| 128 | R-128 | T-4 (2.0 g) | 60 mg | A-7 (9.20 mg) | P-8 (20 mg) | Ethylcellosolve acetate (6.0 g) |
| 129 | R-129 | T-4 (2.0 g) | 60 mg | A-7 (6.13 mg) | P-8 (20 mg) | Ethylcellosolve acetate (6.0 g) |
| 130 | R-130 | T-4 (2.0 g) | 60 mg | A-7 (9.20 mg) | P-8 (20 mg) | Methylmethoxy propionate (6.0 g) |
| 131 | R-131 | T-4 (2.0 g) | 60 mg | A-7 (6.13 mg) | P-8 (20 mg) | Methylmethoxy propionate (6.0 g) |
| 132 | R-132 | T-1 (2.0 g) | 60 mg | A-8 (13.61 mg) | P-1 (20 mg) | Ethylcellosolve acetate (6.0 g) |
| 133 | R-133 | T-1 (2.0 g) | 60 mg | A-8 (7.78 mg) | P-1 (20 mg) | Ethylcellosolve acetate (6.0 g) |
| 134 | R-134 | T-1 (2.0 g) | 60 mg | A-8 (3.89 mg) | P-1 (20 mg) | Ethylcellosolve acetate (6.0 g) |
| 135 | R-135 | T-1 (2.0 g) | 60 mg | A-8 (13.61 mg) | P-1 (20 mg) | Methylmethoxy propionate (6.0 g) |
| 136 | R-136 | T-1 (2.0 g) | 60 mg | A-8 (7.78 mg) | P-1 (20 mg) | Methylmethoxy propionate (6.0 g) |
| 137 | R-137 | T-1 (2.0 g) | 60 mg | A-8 (3.89 mg) | P-1 (20 mg) | Methylmethoxy propionate (6.0 g) |
| 138 | R-138 | T-4 (2.0 g) | 60 mg | A-8 (13.61 mg) | P-1 (20 mg) | Ethylcellosolve acetate (6.0 g) |
| 139 | R-139 | T-4 (2.0 g) | 60 mg | A-8 (7.78 mg) | P-1 (20 mg) | Ethylcellosolve acetate (6.0 g) |
| 140 | R-140 | T-4 (2.0 g) | 60 mg | A-8 (13.61 mg) | P-1 (20 mg) | Methylmethoxy propionate (6.0 g) |
| 141 | R-141 | T-4 (2.0 g) | 60 mg | A-8 (7.78 mg) | P-1 (20 mg) | Methylmethoxy propionate (6.0 g) |
| 142 | R-142 | T-1 (2.0 g) | 60 mg | A-8 (13.61 mg) | P-8 (20 mg) | Ethylcellosolve acetate (6.0 g) |
| 143 | R-143 | T-1 (2.0 g) | 60 mg | A-8 (7.78 mg) | P-8 (20 mg) | Ethylcellosolve acetate (6.0 g) |
| 144 | R-144 | T-1 (2.0 g) | 60 mg | A-8 (3.89 mg) | P-8 (20 mg) | Ethylcellosolve acetate (6.0 g) |
| 145 | R-145 | T-1 (2.0 g) | 60 mg | A-8 (13.61 mg) | P-8 (20 mg) | Methylmethoxy propionate (6.0 g) |
| 146 | R-146 | T-1 (2.0 g) | 60 mg | A-8 (7.78 mg) | P-8 (20 mg) | Methylmethoxy propionate (6.0 g) |
| 147 | R-147 | T-1 (2.0 g) | 60 mg | A-8 (3.89 mg) | P-8 (20 mg) | Methylmethoxy propionate (6.0 g) |
| 148 | R-148 | T-4 (2.0 g) | 60 mg | A-8 (13.61 mg) | P-8 (20 mg) | Ethylcellosolve acetate (6.0 g) |
| 149 | R-149 | T-4 (2.0 g) | 60 mg | A-8 (7.78 mg) | P-8 (20 mg) | Ethylcellosolve acetate (6.0 g) |
| 150 | R-150 | T-4 (2.0 g) | 60 mg | A-8 (13.61 mg) | P-8 (20 mg) | Methylmethoxy propionate (6.0 g) |
| 151 | R-151 | T-4 (2.0 g) | 60 mg | A-8 (7.78 mg) | P-8 (20 mg) | Methylmethoxy propionate (6.0 g) |
| 152 | R-152 | T-1 (2.0 g) | 40 mg | A-9 (0.88 mg) | P-1 (20 mg) | Methylmethoxy propionate (6.0 g) |
| 153 | R-153 | T-1 (2.0 g) | 40 mg | A-9 (1.77 mg) | P-1 (20 mg) | Methylmethoxy propionate (6.0 g) |

TABLE 6-continued

Preparation of photosensitive compositions

| Example No. | Symbol of photo-sensitive composition | Polymer to which group unstable with respect to acid was introduced* (mixing amount) | Mixing amount of onium salt | Component (C) (mixing amount) | Phenol compound (mixing amount) | Organic solvent (mixing amount) |
|---|---|---|---|---|---|---|
| 154 | R-154 | T-1 (2.0 g) | 40 mg | A-9 (2.65 mg) | P-1 (20 mg) | Methylmethoxy propionate (6.0 g) |
| 155 | R-155 | T-1 (2.0 g) | 50 mg | A-9 (1.11 mg) | P-1 (20 mg) | Methylmethoxy propionate (6.0 g) |
| 156 | R-156 | T-1 (2.0 g) | 50 mg | A-9 (2.21 mg) | P-1 (20 mg) | Methylmethoxy propionate (6.0 g) |
| 157 | R-157 | T-1 (2.0 g) | 50 mg | A-9 (3.32 mg) | P-1 (20 mg) | Methylmethoxy propionate (6.0 g) |
| 158 | R-158 | T-4 (2.0 g) | 60 mg | A-9 (1.33 mg) | P-1 (20 mg) | Methylmethoxy propionate (6.0 g) |
| 159 | R-159 | T-4 (2.0 g) | 60 mg | A-9 (2.65 mg) | P-1 (20 mg) | Methylmethoxy propionate (6.0 g) |
| 160 | R-160 | T-4 (2.0 g) | 60 mg | A-9 (3.98 mg) | P-1 (20 mg) | Methylmethoxy propionate (6.0 g) |
| 161 | R-161 | T-1 (2.0 g) | 40 mg | A-9 (0.88 mg) | P-8 (20 mg) | Methylmethoxy propionate (6.0 g) |
| 162 | R-162 | T-1 (2.0 g) | 40 mg | A-9 (1.77 mg) | P-8 (20 mg) | Methylmethoxy propionate (6.0 g) |
| 163 | R-163 | T-1 (2.0 g) | 40 mg | A-9 (2.65 mg) | P-8 (20 mg) | Methylmethoxy propionate (6.0 g) |
| 164 | R-164 | T-1 (2.0 g) | 50 mg | A-9 (1.11 mg) | P-8 (20 mg) | Methylmethoxy propionate (6.0 g) |
| 165 | R-165 | T-1 (2.0 g) | 50 mg | A-9 (2.21 mg) | P-8 (20 mg) | Methylmethoxy propionate (6.0 g) |
| 166 | R-166 | T-1 (2.0 g) | 50 mg | A-9 (3.32 mg) | P-8 (20 mg) | Methylmethoxy propionate (6.0 g) |
| 167 | R-167 | T-4 (2.0 g) | 60 mg | A-9 (1.33 mg) | P-8 (20 mg) | Methylmethoxy propionate (6.0 g) |
| 168 | R-168 | T-4 (2.0 g) | 60 mg | A-9 (2.65 mg) | P-8 (20 mg) | Methylmethoxy propionate (6.0 g) |
| 169 | R-169 | T-4 (2.0 g) | 60 mg | A-9 (3.98 mg) | P-8 (20 mg) | Methylmethoxy propionate (6.0 g) |

*See Table 1

(2) Formation of Patterns

Each of the photosensitive compositions (varnishes) prepared as described above was spin-coated on a 6-inch silicon wafer. The resultant wafer was prebaked on a hot plate at 95° C. for 90 seconds, thereby forming a 1.0-μm thick photosensitive composition film (a resist film). Subsequently, pattern exposure was performed on the resist film by using a KrF excimer laser stepper, and the resultant wafer was baked on a hot plate at 95° C. for 90 seconds. The baked wafer was then dipped in a 1.59% aqueous tetramethylammonium hydroxide solution (an aqueous TMAH solution) for 20 seconds, thereby developing the resist film. Thereafter, the resultant wafer was washed and dried to obtain a pattern consisting of lines and spaces.

The sectional shape of each resultant pattern was observed by using a scanning electron microscope to thereby measure the widths of the lines and the spaces, as a measure of the resolution.

Table 7 below shows the exposure amount (the sensitivity) and the resolution of the photosensitive composition obtained in each example.

TABLE 7

Formation of patterns

| Example | Symbol of photo-sensitive composition | Prebaking conditions | Exposure amount (mJ/cm$^2$) | Baking conditions after exposure | Resolution (μm) |
|---|---|---|---|---|---|
| 63 | R-63 | 95° C. 90 sec | 41 | 95° C. 90 sec | 0.3 |
| 64 | R-64 | " | " | " | 0.275 |
| 65 | R-65 | " | " | " | 0.35 |
| 66 | R-66 | " | " | " | 0.275 |
| 67 | R-67 | " | " | " | 0.3 |
| 68 | R-68 | " | " | " | 0.35 |
| 69 | R-69 | " | " | " | 0.275 |
| 70 | R-70 | " | " | " | 0.3 |
| 71 | R-71 | " | " | " | 0.3 |
| 72 | R-72 | " | " | " | 0.35 |
| 73 | R-73 | " | " | " | 0.3 |
| 74 | R-74 | " | " | " | 0.3 |

TABLE 7-continued

Formation of patterns

| Example | Symbol of photo-sensitive composition | Prebaking conditions | Exposure amount (mJ/cm²) | Baking conditions after exposure | Resolution (μm) |
|---|---|---|---|---|---|
| 75 | R-75 | " | " | " | 0.3 |
| 76 | R-76 | " | " | " | 0.275 |
| 77 | R-77 | " | " | " | 0.3 |
| 78 | R-78 | " | " | " | 0.3 |
| 79 | R-79 | " | " | " | 0.275 |
| 80 | R-80 | " | " | " | 0.3 |
| 81 | R-81 | " | " | " | 0.275 |
| 82 | R-82 | " | " | " | 0.3 |
| 83 | R-83 | " | 35 | " | 0.275 |
| 84 | R-84 | " | 32 | " | 0.25 |
| 85 | R-85 | " | 33 | " | 0.25 |
| 86 | R-86 | " | 35 | " | 0.275 |
| 87 | R-87 | " | 32 | " | 0.275 |
| 88 | R-88 | " | 33 | " | 0.25 |
| 89 | R-89 | " | 35 | " | 0.275 |
| 90 | R-90 | " | 33 | " | 0.25 |
| 91 | R-91 | " | 32 | " | 0.25 |
| 92 | R-92 | " | 35 | " | 0.35 |
| 93 | R-93 | " | " | " | 0.275 |
| 94 | R-94 | " | " | " | 0.35 |
| 95 | R-95 | " | " | " | 0.275 |
| 96 | R-96 | " | " | " | 0.3 |
| 97 | R-97 | " | " | " | 0.3 |
| 98 | R-98 | " | " | " | 0.275 |
| 99 | R-99 | " | " | " | 0.3 |
| 100 | R-100 | " | " | " | 0.275 |
| 101 | R-101 | " | " | " | 0.3 |
| 102 | R-102 | " | " | " | 0.3 |
| 103 | R-103 | " | " | " | 0.3 |
| 104 | R-104 | " | " | " | 0.3 |
| 105 | R-105 | " | 35 | " | 0.275 |
| 106 | R-106 | " | " | " | 0.3 |
| 107 | R-107 | " | " | " | 0.3 |
| 108 | R-108 | " | " | " | 0.275 |
| 109 | R-109 | " | " | " | 0.3 |
| 110 | R-110 | " | " | " | 0.275 |
| 111 | R-111 | " | " | " | 0.3 |
| 112 | R-112 | " | 34 | " | 0.3 |
| 113 | R-113 | " | " | " | 0.275 |
| 114 | R-114 | " | " | " | 0.35 |
| 115 | R-115 | " | " | " | 0.275 |
| 116 | R-116 | " | " | " | 0.3 |
| 117 | R-117 | " | " | " | 0.35 |
| 118 | R-118 | " | " | " | 0.275 |
| 119 | R-119 | " | " | " | 0.35 |
| 120 | R-120 | " | " | " | 0.3 |
| 121 | R-121 | " | " | " | 0.35 |
| 122 | R-122 | " | " | " | 0.3 |
| 123 | R-123 | " | " | " | 0.3 |
| 124 | R-124 | " | " | " | 0.35 |
| 125 | R-125 | " | " | " | 0.3 |
| 126 | R-126 | " | " | " | 0.35 |
| 127 | R-127 | " | " | " | 0.35 |
| 128 | R-128 | " | " | " | 0.275 |
| 129 | R-129 | " | " | " | 0.3 |
| 130 | R-130 | " | " | " | 0.35 |
| 131 | R-131 | " | " | " | 0.35 |
| 132 | R-132 | " | 33 | " | 0.3 |
| 133 | R-133 | " | " | " | 0.275 |
| 134 | R-134 | " | " | " | 0.3 |
| 135 | R-135 | " | " | " | 0.275 |
| 136 | R-136 | " | " | " | 0.3 |
| 137 | R-137 | " | " | " | 0.35 |
| 138 | R-138 | " | " | " | 0.275 |
| 139 | R-139 | " | " | " | 0.3 |
| 140 | R-140 | " | " | " | 0.275 |
| 141 | R-141 | " | " | " | 0.3 |
| 142 | R-142 | " | " | " | 0.3 |
| 143 | R-143 | " | " | " | 0.35 |
| 144 | R-144 | " | " | " | 0.35 |
| 145 | R-145 | " | " | " | 0.275 |
| 146 | R-146 | " | " | " | 0.3 |
| 147 | R-147 | " | " | " | 0.35 |
| 148 | R-148 | " | " | " | 0.275 |

TABLE 7-continued

Formation of patterns

| Example | Symbol of photo-sensitive composition | Prebaking conditions | Exposure amount (mJ/cm²) | Baking conditions after exposure | Resolution (μm) |
|---|---|---|---|---|---|
| 149 | R-149 | " | " | " | 0.3 |
| 150 | R-150 | " | " | " | 0.3 |
| 151 | R-151 | " | " | " | 0.35 |
| 152 | R-152 | " | 35 | " | 0.275 |
| 153 | R-153 | " | " | " | 0.3 |
| 154 | R-154 | " | " | " | 0.35 |
| 155 | R-155 | " | " | " | 0.275 |
| 156 | R-156 | " | " | " | 0.3 |
| 157 | R-157 | " | " | " | 0.35 |
| 158 | R-158 | " | " | " | 0.275 |
| 159 | R-159 | " | " | " | 0.3 |
| 160 | R-160 | " | " | " | 0.3 |
| 161 | R-161 | " | " | " | 0.275 |
| 162 | R-162 | " | " | " | 0.3 |
| 163 | R-163 | " | " | " | 0.35 |
| 164 | R-164 | " | " | " | 0.275 |
| 165 | R-165 | " | " | " | 0.3 |
| 166 | R-166 | " | " | " | 0.3 |
| 167 | R-167 | " | " | " | 0.3 |
| 168 | R-168 | " | " | " | 0.3 |
| 169 | R-169 | " | " | " | 0.3 |

As is apparent from the above results, each photosensitive composition of the present invention had a high sensitivity and a high resolution. In addition, each pattern resulting from any of the compositions of the present invention had a rectangular sectional shape and a steep side surface in a line portion.

Also, when the patterns were formed by using the compositions [R-63] to [R-169], it was possible to reduce the generation of a standing wave on the side surfaces of each pattern as shown in FIG. 2. Consequently, the pattern formation could be done with a higher accuracy.

Comparative Example 1

2.0 g of the polymer [T-1] to which a group unstable with respect to an acid was introduced and 30 mg of an onium salt (triphenylsulfoniumtrifulate) as a photo-acid generator were dissolved in 6.00 g of ethylcellosolve acetate. The resultant solution was filtered through a filter with a pore size of 0.2 μm, thereby preparing a photosensitive composition [R-170] in the form of a varnish.

Pattern formation was performed by using the photosensitive composition [R-170] in accordance with the same method and conditions as in the above examples.

The sectional shape of the resultant pattern was observed by using a scanning electron microscope to thereby measure the widths of lines and spaces, as a measure of the resolution. As a result, the resolution was 0.35 μm for an exposure amount of 40 mJ/cm². However, an overhang-like sparingly soluble layer was formed on the surface layer of this pattern. This reason for this is assumed that neither a specific amine compound nor a specific phenol compound such as those used in the above examples was mixed in the photosensitive composition [R-170].

Comparative Example 2

2.0 g of the polymer [T-5] to which a group unstable with respect to an acid was introduced and 30 mg of an onium salt (triphenylsulfoniumtrifulate) as a photo-acid generator were dissolved in 6.00 g of methylmethoxy propionate. The resultant solution was filtered through a filter with a pore size of 0.2 μm, thereby preparing a photosensitive composition [R-171] in the form of a varnish.

Pattern formation was performed by using the photosensitive composition [R-171] in accordance with the same method and conditions as in the above examples.

The sectional shape of the resultant pattern was observed by using a scanning electron microscope to thereby measure the widths of lines and spaces, as a measure of the resolution. As a result, the resolution was 0.40 μm for an exposure amount of 43 mJ/cm². However, an overhang-like sparingly soluble layer was formed on the surface layer of this pattern. This reason for this is assumed that neither a specific amine compound nor a specific phenol compound such as those used in the above examples was mixed in the photosensitive composition [R-171].

Comparative Example 3

2.0 g of the polymer [T-1] to which a group unstable with respect to an acid was introduced and 40 mg of an onium salt (triphenylsulfoniumtrifulate) as a photo-acid generator were dissolved in 6.00 g of ethylcellosolve acetate. The resultant solution was filtered through a filter with a pore size of 0.2 μm, thereby preparing a photosensitive composition [R-172] in the form of a varnish.

Pattern formation was performed by using the photosensitive composition [R-172] in accordance with the same method and conditions as in the above examples.

The sectional shape of the resultant pattern was observed by using a scanning electron microscope to thereby measure the widths of lines and spaces, as a measure of t he resolution. As a result, the resolution was 0.40 μm for an exposure amount of 40 mJ/cm². However, an overhang-like sparingly soluble layer was formed on the surface layer of this pattern. This reason for this is assumed that neither a specific amine compound nor a specific phenol compound such as those used in the above examples was mixed in the photosensitive composition [R-172].

Example 173

The following test was conducted to check the temperature dependence of the photosensitive composition of the present invention.

(1) Preparation of Photosensitive Composition Consisting of Polymer to which Group Unstable with Respect to Acid was Introduced, Onium Salt, and Amine Compound.

2.0 g of the polymer [T-5] to which a group unstable with respect to an acid was introduced, 40 mg of an onium salt (triphenylsulfoniumtrifulate) as a photo-acid generator, and an amine compound were dissolved in 6.00 g of methylmethoxy propionate. The resultant solution was filtered through a filter with a pore size of 0.2 fm, thereby preparing the photosensitive composition [R-15] in the form of a varnish.

(2) Formation of Patterns

The photosensitive composition (varnish) prepared as described above was spin-coated on 6-inch silicon wafers. The resultant wafers were prebaked on a hot plate in accordance with the conditions shown in Table 8 below, thereby forming 1.0-$\mu$m thick photosensitive composition films (resist films). Subsequently, pattern exposure was performed on the resist films by using a KrF excimer laser stepper, and the resultant wafers were baked on a hot plate in accordance with the conditions given in Table 8 below. Each baked wafer was then dipped in a 1.59% aqueous tetramethylammonium hydroxide solution (an aqueous TMAH solution) for 20 seconds, thereby developing the resist film. Thereafter, the resultant wafers were washed and dried to obtain patterns consisting of lines and spaces.

The sectional shape of each resultant pattern was observed by using a scanning electron microscope to thereby measure the widths of the lines and the spaces, as a measure of the resolution. Table 8 below shows the exposure amounts (the sensitivity) and the resolutions of the photosensitive composition obtained under these different temperature conditions.

TABLE 8

Relationship between baking temperature, baking temperature after exposure, sensitivity, and resolution

| Baking temperature (° C.) | Baking temperature after exposure (° C.) | Sensitivity (mJ) | Resolution |
|---|---|---|---|
| 70 | 70 | 34 | 0.35 |
| 80 | 80 | 24 | 0.275 |
| 90 | 90 | 22 | 0.275 |
| 100 | 100 | 23 | 0.35 |

Example 174

The following test was conducted to check the standing time dependence of the photosensitive composition of the present invention.

(1) Preparation of Photosensitive Composition Consisting of Polymer to which group Unstable with Respect to Acid was Introduced, Onium Salt, and amine Compound. 2.0 g of the polymer [T-5] to which a group unstable with respect to an acid was introduced, 40 mg of an onium salt (triphenylsulfoniumtrifulate) as a photo-acid generator, and an amine compound were dissolved in 6.00 g of methylmethoxy propionate. The resultant solution was filtered through a filter with a pore size of 0.2 $\mu$m, thereby preparing the photosensitive composition [R-15] in the form of a varnish.

(2) Formation of Patterns

Figure 4:
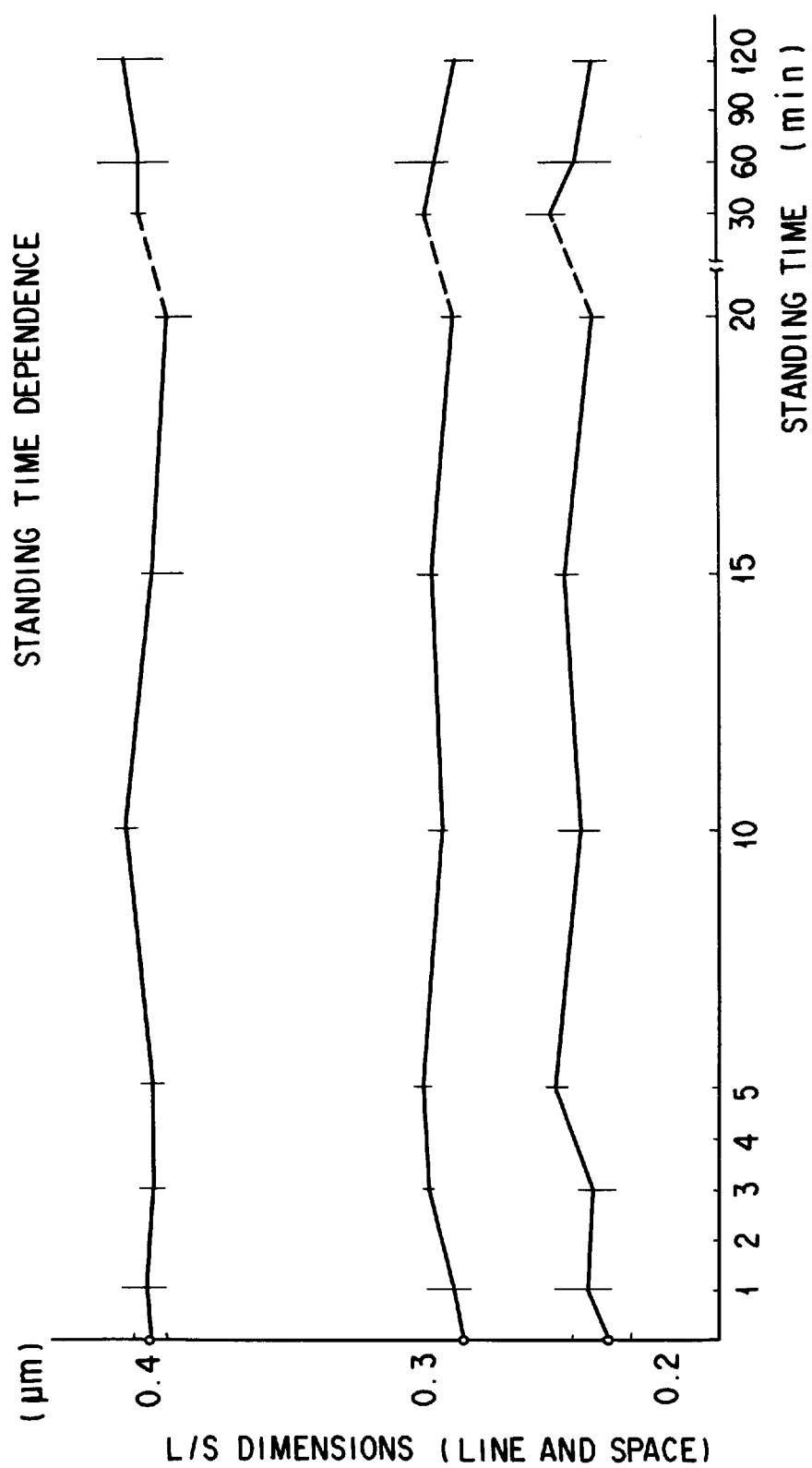
FIG. 4 is a graph showing the standing time dependence of the photosensitive composition of the present invention.

The photosensitive composition (varnish) prepared as described above was spin-coated on 6-inch silicon wafers. The resultant wafers were prebaked on a hot plate at 95° C. for 90 seconds, thereby forming 1.0-$\mu$m thick photosensitive composition films (resist films). Subsequently, pattern exposure was performed on the resist films by using a KrF excimer laser stepper. The resultant wafers were left to stand in the interfaces between an excimer stepper, a resist coater, and a developing apparatus for 0 to a maximum of 120 minutes as shown in FIG. 4 and baked on a hot plate at 95° C. for 90 seconds. Each baked wafer was then dipped in a 1.59% aqueous tetramethylammonium hydroxide solution (an aqueous TMAH solution) for 20 seconds, thereby developing the resist film. Thereafter, the resultant wafers were washed and dried to obtain patterns consisting of lines and spaces.

The sectional shape of each resultant pattern was observed by using a scanning electron microscope to thereby measure the widths of the lines and the spaces, as a measure of the resolution. FIG. 4 shows the change in the widths of the lines and the spaces for each standing time.

According to the present invention as has been described in detail above, there is provided a photosensitive composition which has a high sensitivity and a high resolution with respect to particularly a light source having a short wavelength, which does not cause a phase separation in a film state, which is not readily influenced by the surrounding environment, and by which a fine pattern with a rectangular sectional shape can be formed stably. This photosensitive composition and the formation of a resist pattern using the photosensitive composition can achieve a startling effect in the photolithography technique of the semiconductor device fabricating process and therefore has a very high industrial value.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming a pattern, comprising forming a resin layer on a substrate, said resin layer being made of mainly a composition comprising:
  (a) a polymer obtained by protecting an alkali soluble group of an alkali-soluble polymer by a group which is unstable to an acid;
  (b) a compound which generates an acid upon being irradiated with light; and
  (c) at least one compound which is selected from the group consisting of an imidazole compound, an alanine compound, an adenine compound, an adenosine compound, and a quaternary ammonium salt compound, and which increases miscibility in the resist film;
    subjecting said resin layer to a pattern exposure; baking said resin layer obtained after said pattern exposure; and
    developing said resin layer obtained after said pattern exposure with an alkali aqueous solution or an organic solvent as a developing solution, wherein with addition of the component (c), miscibility of the resist film is enhanced, phase separation of the resist film is avoided when the resist film is formed, and the components have a uniform concentration distribution within the film; and wherein said polymer (a) has repeating units of the formula:

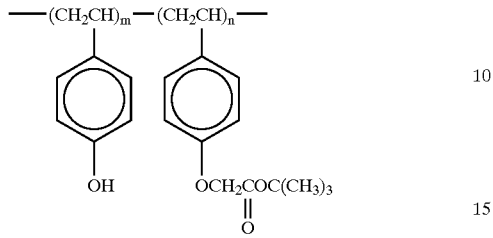

wherein m is from 0.75 to 0.85, and n is from 0.15 to 0.25, and are each molar ratios, and (c) is at least one member selected from the group consisting of (A-1), (A-2), and (A-3) below (A-1):

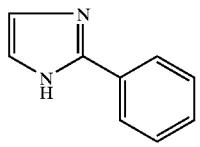

(A-2):

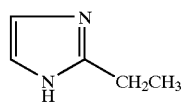

(A-3):

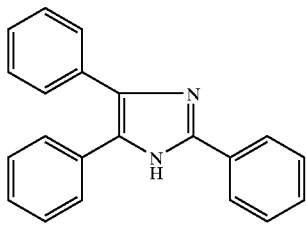

2. The method of forming a pattern of a resist film according to claim 1,
wherein said protection group unstable with respect to an acid is selected from the group consisting of tetrahydropyranoether, benzyl ether, methyl ether, ethyl ether, n-propyl ether, isopropyl ether, tert-butyl ether, allyl ether, methoxymethyl ether, p-bromophenacyl ether, trimethylsilyl ether, benzyloxycarbonyl ether, tertbutoxycarbonyl ether, tert-butyl acetate, 4-tert-butylbenzyl ether, methyl ester, ethyl ester, n-propylester, isopropyl ester, tertbutyl ester, n-butyl ester, isobutyl ester and benzyl ester.

3. The method of forming a pattern of a resist film according to claim 1, wherein said component (b) is a material selected from the group consisting of an organic halogenated compound, orthoquinone-disulfonic acid chloride and a sulfonate.

4. The method of forming a pattern of a resist film according to claim 1, wherein said protected polymer (a) has a molecular weight of at least 1,000, with which thermal resistance thereof is improved.

5. A method of forming a pattern, comprising:

forming a resin layer on a substrate, said resin layer made of mainly a composition comprising:
(a) a polymer obtained by protecting an alkali soluble group of an alkali-soluble polymer by a group which is unstable to an acid;
(b) a compound which generates an acid upon being irradiated with light; and
(d) a phenol compound for enhancing miscibility within the resist film, subjecting said resin layer to a pattern exposure;
baking said resin layer obtained after said pattern exposure; and
developing said resin layer obtained after said pattern exposure with an alkali aqueous solution or an organic solvent as a developing solution,
wherein with addition of the component (d), miscibility of the resist film is enhanced, phase separation of the resist film is avoided when the resist film is formed, and the components have a uniform concentration distribution within the film; and wherein said polymer (a) has repeating units of the formula:

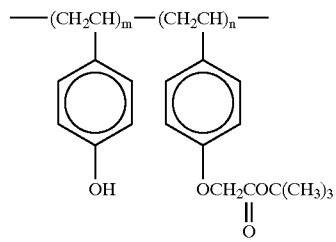

wherein m is from 0.75 to 0.85, and n is from 0.15 to 0.25, and are each molar ratios and (d) is at least one member selected from the group consisting of (P-1), (P-2), (P-3), (P-4), and (P-5) below

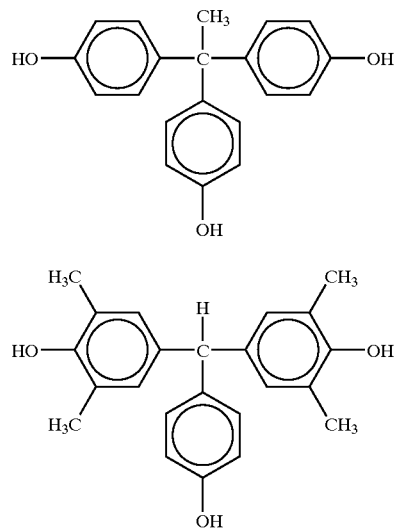

(P-3):
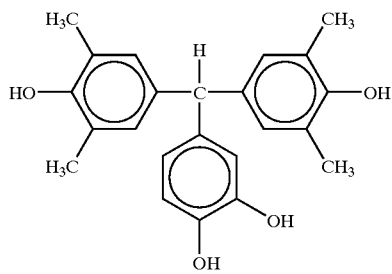

(P-4):
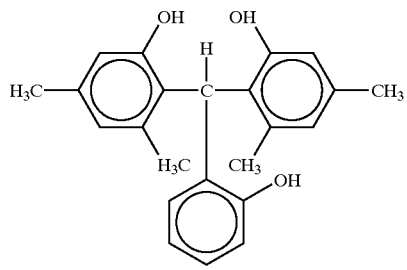

(P-5):
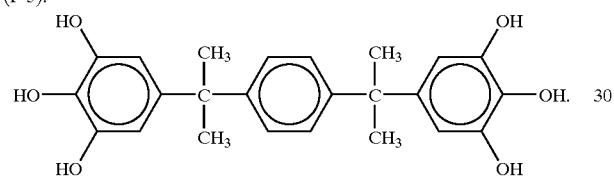

6. The method of forming a pattern of a resist film according to claim 5,
wherein said protection group unstable with respect to an acid is selected from the group consisting of tetrahydropyranoether, benzyl ether, methyl ether, ethyl ether, n-propyl ether, isopropyl ether, tert-butyl ether, allyl ether, methoxymethyl ether, p-bromophenacyl ether, trimethylsilyl ether, benzyloxycarbonyl ether, tertbutoxycarbonyl ether, tert-butyl acetate, 4-tert-butylbenzyl ether, methyl ester, ethyl ester, n-propylester, isopropyl ester, tertbutyl ester, n-butyl ester, isobutyl ester and benzyl ester.

7. The method of forming a pattern of a resist film according to claim 5, wherein said component (b) is a material selected from the group consisting of an organic halogenated compound, orthoquinone-disulfonic acid chloride and a sulfonate.

8. The method of forming a pattern of a resist film according to claim 5, wherein said protected polymer (a) has a molecular weight of at least 1,000, with which thermal resistance thereof is improved.

9. A method of forming a pattern, comprising:
forming a resin layer on a substrate, said resin layer made of mainly a composition comprising:
(a) a polymer obtained by protecting an alkali soluble group of an alkali-soluble polymer by a group which is unstable to an acid;
(b) a compound which generates an acid upon being irradiated with light;
(c) at least one compound which is selected from the group consisting of an imidazole compound, an alanine compound, an adenine compound, an adenosine compound, and a quaternary ammonium salt compound, and which increases miscibility in the resist film; and
(d) a phenol compound for enhancing miscibility within the resist film, subjecting said resin layer to a pattern exposure;
baking said resin layer obtained after said pattern exposure; and
developing said resin layer obtained after said pattern exposure with an alkali aqueous solution or an organic solvent as a developing solution,
wherein with addition of the components (c) and (d), miscibility of the resist film is enhanced, phase separation of the resist film is avoided when the resist film is formned, and the components have a uniform concentration distribution within the film; and wherein
said polymer (a) has repeating units of the formula:

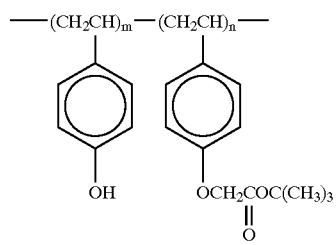

wherein m is from 0.75 to 0.85, and n is from 0.15 to 0.25, and are each molar ratios, (c) is at least one member selected from the group consisting of (A-1), (A-2), and (A-3) below (A-1):

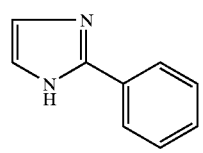

(A-2):

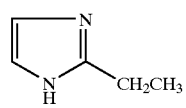

(A-3):

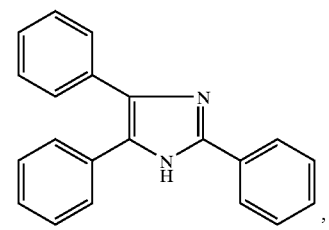

and (d) is at least one member selected from the group consisting of (P-1), (P-2), (P-3), (P-4), and (P-5) below (P-1): 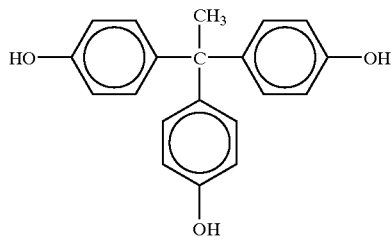

(P-2): 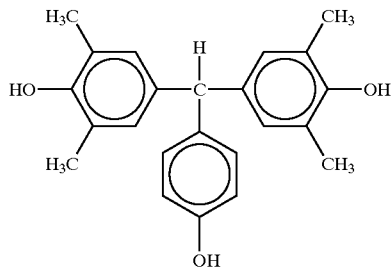

(P-3): 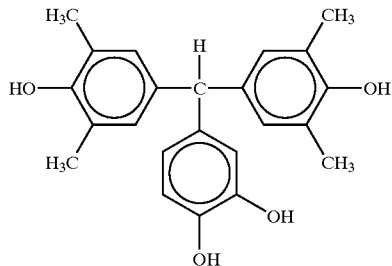

(P-4): 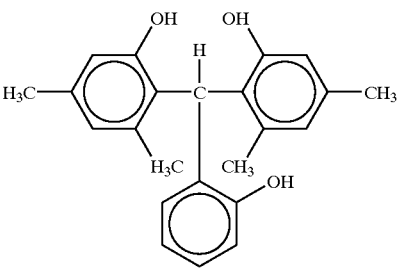

(P-5): 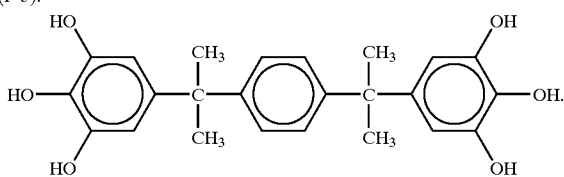

10. The method of forming a pattern of a resist film according to claim 9, wherein said protection group unstable with respect to an acid is selected from the group consisting of tetrahydropyranoether, benzyl ether, methyl ether, ethyl ether, n-propyl ether, isopropyl ether, tert-butyl ether, allyl ether, methoxymethyl ether, p-bromophenacyl ether, trimethylsilyl ether, benzyloxycarbonyl ether, tertbutoxycarbonyl ether, tert-butyl acetate, 4-tert-butylbenzyl ether, methyl ester, ethyl ester, n-propylester, isopropyl ester, tertbutyl ester, n-butyl ester, isobutyl ester and benzyl ester.

11. The method of forming a pattern of a resist film according to claim 9, wherein said component (b) is a material selected from the group consisting of an organic halogenated compound, orthoquinone-disulfonic acid chloride and a sulfonate.

12. The method of forming a pattern of a resist film according to claim 9, wherein said protected polymer (a) has a molecular weight of at least 1,000, with which thermal resistance thereof is improved.

13. A method of enhancing miscibility of a resist film, comprising (1) preparing a uniform mixture comprising:
(a) a polymer obtained by protecting an alkali soluble group of an alkali-soluble polymer by a group which is unstable to an acid;
(b) a compound which generates an acid upon being irradiated with light; and
(c) at least one compound which is selected from the group consisting of an imidazole compound, an alanine compound, an adenine compound, an adenosine compound, and a quaternary ammonium salt compound, and which increases miscibility in the resist film;

2) applying said uniform mixture on a substrate,
wherein with addition of the component (c), the miscibility of the resist film is enhanced, phase separation of the resist film is avoided when the resist film is formed, and the components have a uniform concentration distribution within the film; and wherein said polymer (a) has repeating units of the formula:

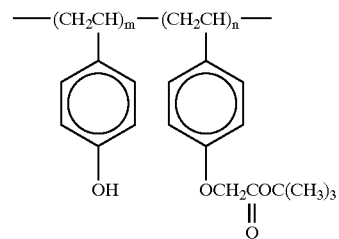

wherein m is from 0.75 to 0.85, and n is from 0.15 to 0.25, and are each molar ratios, and (c) is at least one member selected from the group consisting of (A-1), (A-2), and (A-3) below (A-1): 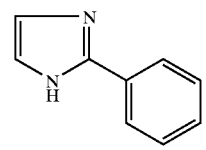

(A-2): 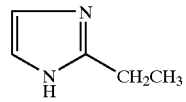

(A-3):

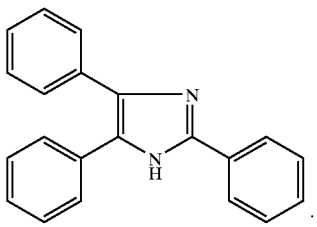

(P-1):

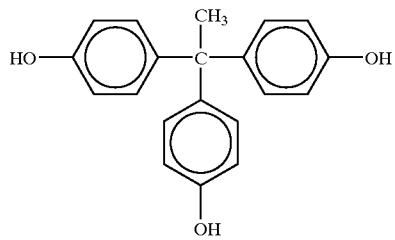

(P-2):

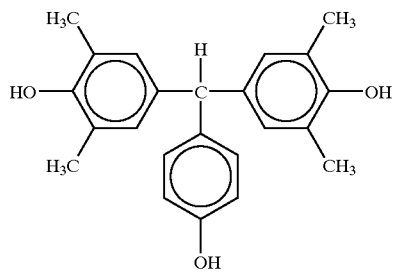

(P-3):

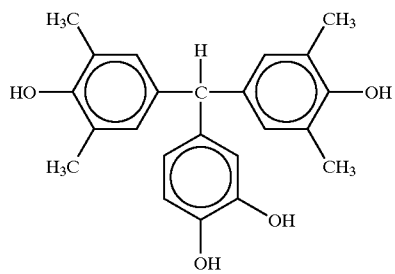

(P-4):

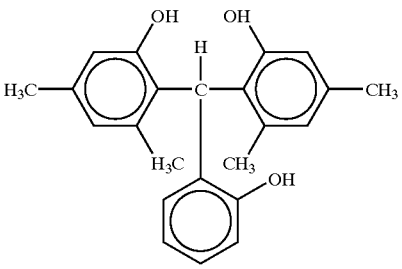

(P-5):

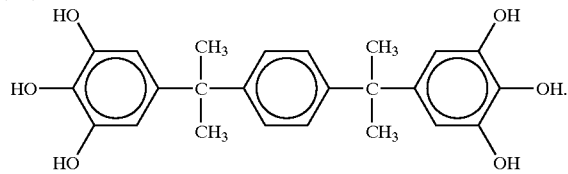

14. The method of enhancing miscibility of a resist film according to claim 13,
wherein said protection group unstable with respect to an acid is selected from the group consisting of tetrahydropyranoether, benzyl ether, methyl ether, ethyl ether, n-propyl ether, isopropyl ether, tert-butyl ether, allyl ether, methoxymethyl ether, p-bromophenacyl ether, trimethylsilyl ether, benzyloxycarbonyl ether, tertbutoxycarbonyl ether, tert-butyl acetate, 4-tert-butylbenzyl ether, methyl ester, ethyl ester, n-propylester, isopropyl ester, tertbutyl ester, n-butyl ester, isobutyl ester and benzyl ester.

15. The method of enhancing miscibility of a resist film according to claim 13, wherein said component (b) is a material selected from the group consisting of an organic halogenated compound, orthoquinone-disulfonic acid chloride and a sulfonate.

16. The method of enhancing miscibility of a resist film according to claim 13, wherein said protected polymer (a) has a molecular weight of at least 1,000, with which thermal resistance thereof is improved.

17. A method of enhancing miscibility of a resist film, comprising:
(1) preparing a uniform mixture comprising:
(a) a polymer obtained by protecting an alkali soluble group of an alkali-soluble polymer by a group which is unstable to an acid;
(b) a compound which generates an acid upon being irradiated with light; and
(d) a phenol compound for enhancing miscibility within the resist film, subjecting said resin layer to a pattern exposure;
2) applying said uniform mixture on a substrate,
wherein with addition of the component (c), the miscibility of the resist film is enhanced, phase separation of the resist film is avoided when the resist film is formed, and the components have a uniform concentration distribution within the film; and
wherein
said polymer (a) has repeating units of the formula:

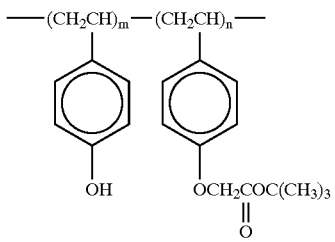

wherein m is from 0.75 to 0.85, and n is from 0.15 to 0.25, and are each molar ratios and (d) is at least one member selected from the group consisting of (P-1), (P-2), (P-3), (P-4), and (P-5) below 18. The method of enhancing miscibility of a resist film according to claim 17,
wherein said protection group unstable with respect to an acid is selected from the group consisting of tetrahydropyranoether, benzyl ether, methyl ether, ethyl ether, n-propyl ether, isopropyl ether, tert-butyl ether, allyl ether, methoxymethyl ether, p-bromophenacyl ether, trimethylsilyl ether, benzyloxycarbonyl ether, tertbutoxycarbonyl ether, tert-butyl acetate, 4-tert-butylbenzyl ether, methyl ester, ethyl ester, n-propylester, isopropyl ester, tertbutyl ester, n-butyl ester, isobutyl ester and benzyl ester.

19. The method of enhancing miscibility of a resist film according to claim 17, wherein said component (b) is a material selected from the group consisting of an organic halogenated compound, orthoquinone-disulfonic acid chloride and a sulfonate.

20. The method of enhancing miscibility of a resist film according to claim 17, wherein said protected polymer (a) has a molecular weight of at least 1,000, with which thermal resistance thereof is improved.

21. A method of enhancing miscibility of a resist film, comprising:
(1) preparing a uniform mixture comprising:
   (a) a polymer obtained by protecting an alkali soluble group of an alkali-soluble polymer by a group which is unstable to an acid;
   (b) a compound which generates an acid upon being irradiated with light;
   (c) at least one compound which is selected from the group consisting of an imidazole compound, an alanine compound, an adenine compound, an adenosine compound, and a quaternary ammonium salt compound, and which increases miscibility in the resist film; and
   (d) a phenol compound for enhancing miscibility within the resist film, subjecting said resin layer to a pattern exposure;
2) applying said uniform mixture on a substrate,
   wherein with addition of the component (c), the miscibility of the resist film is enhanced, phase separation of the resist film is avoided when the resist film is formed, and the components have a uniform concentration distribution within the film; and wherein
   said polymer (a) has repeating units of the formula:

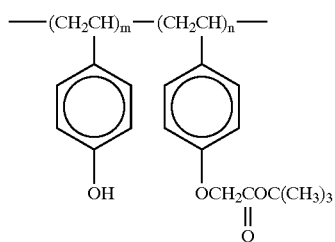

wherein m is from 0.75 to 0.85, and n is from 0.15 to 0.25, and are each molar ratios, (c) is at least one member selected from the group consisting of (A-1), (A-2), and (A-3) below (A-1):

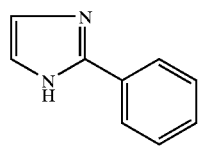

(A-2):

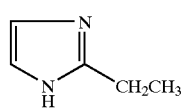

(A-3):

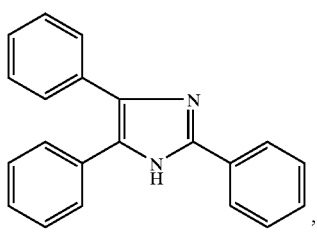

and (d) is at least one member selected from the group consisting of (P-1), (P-2), (P-3), (P-4), and (P-5) below (P-1):

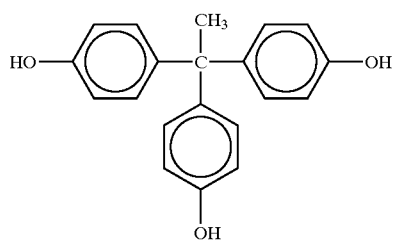

(P-2):

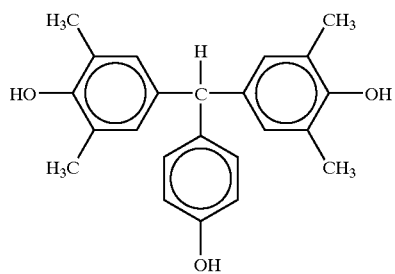

(P-3):

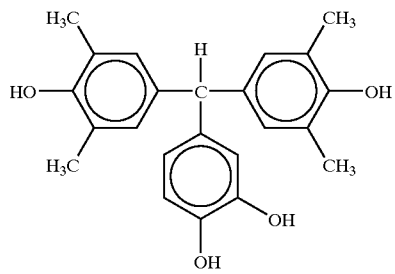

(P-4):

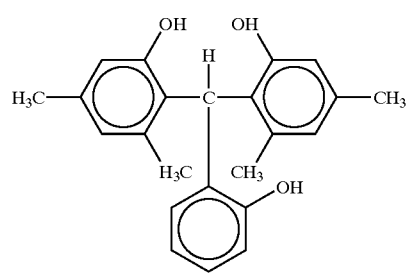

(P-5):

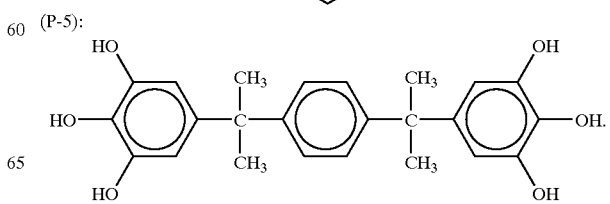

22. The method of enhancing miscibility of a resist film according to claim 21,
wherein said protection group unstable with respect to an acid is selected from the group consisting of tetrahydropyranoether, benzyl ether, methyl ether, ethyl ether, n-propyl ether, isopropyl ether, tert-butyl ether, allyl ether, methoxymethyl ether, p-bromophenacyl ether, trimethylsilyl ether, benzyloxycarbonyl ether, tertbutoxycarbonyl ether, tert-butyl acetate, 4-tert-butylbenzyl ether, methyl ester, ethyl ester, n-propylester, isopropyl ester, tertbutyl ester, n-butyl ester, isobutyl ester and benzyl ester.

23. The method of enhancing miscibility of a resist film according to claim 21, wherein said component (b) is a material selected from the group consisting of an organic halogenated compound, orthoquinone-disulfonic acid chloride and a sulfonate.

24. The method of enhancing miscibility of a resist film according to claim 21, wherein said protected polymer (a) has a molecular weight of at least 1,000, with which thermal resistance thereof is improved.

* * * * *